(12) United States Patent
Uemichi

(10) Patent No.: US 9,812,755 B2
(45) Date of Patent: Nov. 7, 2017

(54) MODE CONVERTER BETWEEN A PLANE CIRCUIT AND A SUBSTRATE WAVEGUIDE INCLUDING A PIN HAVING A LAND AND AN ANTI-PAD

(71) Applicant: FUJIKURA LTD., Tokyo (JP)

(72) Inventor: Yusuke Uemichi, Sakura (JP)

(73) Assignee: FUJIKURA LTD., Koto-ku, Tokyo (JP)

( * ) Notice: Subject to any disclaimer, the term of this patent is extended or adjusted under 35 U.S.C. 154(b) by 0 days.

(21) Appl. No.: 14/749,839

(22) Filed: Jun. 25, 2015

(65) Prior Publication Data

US 2015/0295295 A1    Oct. 15, 2015

Related U.S. Application Data

(63) Continuation of application No. PCT/JP2013/085201, filed on Dec. 27, 2013.

(30) Foreign Application Priority Data

Dec. 27, 2012   (JP) .................... 2012-283993

(51) Int. Cl.
*H01P 5/107* (2006.01)
*H01P 5/103* (2006.01)
(Continued)

(52) U.S. Cl.
CPC ............ *H01P 5/107* (2013.01); *H01P 3/003* (2013.01); *H01P 3/121* (2013.01); *H01P 5/103* (2013.01);
(Continued)

(58) Field of Classification Search
CPC ................. H01P 5/107; H01P 5/103
(Continued)

(56) References Cited

U.S. PATENT DOCUMENTS 5,045,820 A * 9/1991 Leicht et al. ........... H01P 5/107
333/238
8,581,412 B2 * 11/2013 Pilard et al. ............ H01P 1/207
257/621

(Continued)

FOREIGN PATENT DOCUMENTS

CN    102696145 A   9/2012
JP    2005-051331 A   2/2005
(Continued)

OTHER PUBLICATIONS

Clenet et al., "Laminated Waveguide as Radiating Element for Array Applications," IEEE Transaction on Antennas and propagation, May 2006, vol. 54, No. 5, pp. 1481-1487.
(Continued)

*Primary Examiner* — Benny Lee
(74) *Attorney, Agent, or Firm* — Sughrue Mion, PLLC

(57) ABSTRACT

A mode converter includes a substrate including a first main surface and a second main surface, a first ground conductor layer formed on the first main surface, a second ground conductor layer formed on the second main surface, a plane circuit that is formed on the first main surface and propagates a high frequency, a pin that is connected to the plane circuit, is formed inside a through-hole which penetrate from the first main surface to the second main surface, and communicates with the first main face and the second main surface, and an anti-pad that is formed between an end portion of the pin exposed in the second main surface and the second ground conductor layer.

9 Claims, 24 Drawing Sheets

(51) Int. Cl.
*H01P 3/12* (2006.01)
*H01P 3/00* (2006.01)

(52) U.S. Cl.
CPC ............... *H01L 2224/16227* (2013.01); *H01L 2224/48091* (2013.01); *H01L 2224/48227* (2013.01); *H01L 2924/15153* (2013.01); *H01L 2924/15311* (2013.01)

(58) Field of Classification Search
USPC .......................................................... 333/26
See application file for complete search history.

(56) References Cited

U.S. PATENT DOCUMENTS

| | | | |
|---|---|---|---|
| 2005/0029632 A1 | 2/2005 | McKinzie, III et al. | |
| 2011/0084398 A1 | 4/2011 | Pilard et al. | |
| 2011/0267152 A1 | 11/2011 | Lee | |
| 2011/0279200 A1* | 11/2011 | Vangala | H01P 1/2088 333/209 |
| 2012/0242421 A1 | 9/2012 | Robin et al. | |
| 2013/0154759 A1* | 6/2013 | Morita et al. | H01P 3/081 333/26 |

FOREIGN PATENT DOCUMENTS

| | | |
|---|---|---|
| JP | 2011-082337 A | 4/2011 |
| JP | 2011-109438 A | 6/2011 |

OTHER PUBLICATIONS

Communication dated Feb. 9, 2016 from Japanese Patent Office in counterpart Application No. 2014-554609.
Communication dated May 31, 2016 issued by the Japanese Patent Office in counterpart application No. 2014-554609.
Ryosuke Suga et al., "Cost-Effective 60-GHz Antenna-Package with End-Fire Radiation from Open-Ended Post-Wall Waveguide for Wireless File-Transfer System", 2010 IEEE MTT-S International Microwave Symposium, pp. 449-452.
E. Arnieri et al., "Coaxially fed substrate integrated radiating waveguides", Antennas and Propagation Society International Symposium, 2007 IEEE, Jun. 2007, pp. 2718-2721.
Communication dated Oct. 20, 2015, issued by the Japan Patent Office in corresponding Japanese Application No. 2014-554609.
Communication dated Sep. 23, 2016 from the State Intellectual Property Office of the P.R.C. in counterpart application No. 201380068055.X.
Communication dated Jul. 14, 2016, issued by the European Patent Office in corresponding European Application No. 13866566.6.

* cited by examiner

L<2d (X<d)

PRIOR ART

PRIOR ART

MODE CONVERTER BETWEEN A PLANE CIRCUIT AND A SUBSTRATE WAVEGUIDE INCLUDING A PIN HAVING A LAND AND AN ANTI-PAD

CROSS REFERENCE TO RELATED APPLICATIONS

This application is a continuation application based on a PCT Patent Application No. PCT/JP2013/085201, filed Dec. 27, 2013, whose priority is claimed on Japanese Patent Application No. 2012-283993 filed Dec. 27, 2012, the entire contents of which are hereby incorporated by reference.

BACKGROUND OF THE INVENTION

Field of the Invention

The present invention relates to a mode converter, and particularly relates to a technique that is used in a waveguide for a communication using a millimeter-wave band.

Description of the Related Art

In recent years, high-capacity and high-speed communication of several Gbps using a millimeter-wave band has been proposed, and some are being currently implemented. In particular, wireless communication devices operating in the 60 GHz band have become increasingly more important. Such devices are expected to become widespread in the consumer field since a broad frequency band up to 57-66 GHz can be used without a license, and therefore, realizing an inexpensive and compact millimeter-wave communication module is in urgent need.

As forms of implementing a compact and low-cost millimeter-wave communication module, in R. Suga, et al. "Cost-Effective 60-GHz Antenna-Package with End-Fire Radiation from Open-Ended Post-Wall Waveguide for Wireless File-Transfer System", 2010 IEEE MTT-S International Microwave Symposium, pp. 449-452 and Japanese Unexamined Patent Application, First Publication No. 2011-109438, a millimeter-wave module using a waveguide (PWA Post-wall Waveguide Antenna) by a printed wiring board is disclosed.

As shown in Japanese Unexamined Patent Application, First Publication No. 2011-109438, in the technique described above, the sidewalls (metal walls) of the conventional waveguide are replaced with a group of through-holes (post group) of the printed wiring board. A wireless communication IC (CMOS-IC) is mounted on the PWA. The millimeter-wave signals which are outputted from the wireless communication IC (referred to as a semiconductor chip in the specification of Japanese Unexamined Patent Application, First Publication No. 2011-109438 and the same applies hereinafter) by methods of wire bonding, a bump connection and the like are once transmitted through transmission lines (described as a line of a microstrip, a coplanar, strip and the like) of a plane circuit. Ultimately, the signals are guided to a waveguide structure portion (described as a waveguide) through a plane circuit and waveguide conversion structure (described as a center conductor).

FIG. 35 is a cross-sectional view showing an exemplary configuration of a conventional mode converter (converter). As shown in FIG. 35, in the converter 810, the waveguide 802 has an opening 825 that emits radio waves at a front end surface (right-hand side in FIG. 35). The waveguide 802 is configured with a plurality of post (column) walls 820 and ground conductor layers (copper foils) 821, 822. In the waveguide 802, a pin (plane circuit or waveguide converter) 823 is inserted as a power source. Millimeter-wave signals that are introduced into the pin 823 from the transmission line 824 are emitted as electromagnetic waves from the opening portion 825 which is formed ahead of the waveguide 802. The converter 810 which is an antenna package is stacked and formed in a multiple-layer manner via conductors 827A, 827B and a plurality of substrates 828A, 828B, 828C which are dielectric. The pin 823 is formed such that vias are formed in advance in the substrates 828B and 828C, and then the substrates are laminated.

In a high frequency circuit in general, impedance matching is necessary when two circuits are connected. This means that signals can be transmitted without being reflected at a connection point of the two circuits. In particular, at a connection point of a plane circuit or a transmission line as a first circuit and a waveguide as a second circuit, it is necessary to transmit the signals without reflection. In the structure shown in FIG. 35, in a predetermined frequency band, the impedance is matched by adjusting the length of the pin 823 to a predetermined value to realize signal transmission where the reflection loss is reduced. In addition, as one of the impedance matching methods, there is a method of optimizing a distance between the pin 823 and the ground conductor layer 822.

In conventional methods of manufacturing a converter, since vias are formed in advance in a plurality of substrates each having a fixed thickness and a pin is manufactured by stacking the plurality of substrates, the length of the pin can have only discrete values depending on the thickness of the substrates and the impedance adjustment is not easy. In addition, the thickness of each substrate to be stacked cannot be determined individually and depends on such as the availability of materials thereof. Therefore, it is not easy to realize a pin having an optimal length.

In addition, the pin in the conventional converter is configured in the substrate. Therefore, in practice, it is difficult to check to which position the pin is extended in the substrate. In particular, after the converter is completed, a distance between the pin 823 and the ground conductor layer 822 cannot be adjusted (see Japanese Unexamined Patent Application, First Publication No. 2011-082337).

In the structure described above, due to the influence of an adhesive used when the substrates are stacked and a positional deviation of the conductor during stacking the substrates, reflection characteristics are deteriorated and the like and the characteristics as designed are not be obtained, thereby causing an increase of a loss in the waveguide and the like.

Furthermore, the conventional converters include a structure where a plurality of substrates in which a via is formed are stacked. Therefore, unfavorable conditions arise such as an increase of the number of processing steps, an increase of transmission loss due to an adhesive, variations of transmission characteristics caused by materials of the respective layers, and a difficulty in obtaining the materials.

The present invention is made in consideration of the above-described points, and provides a mode converter which includes an optimum pin and is capable of being easily checked and adjusting a distance between a ground conductor layer and a tip of a pin. In addition, the present invention provides a mode converter having a high manufacturing efficiency by reducing the number of processing steps to have optimal characteristics.

SUMMARY OF THE INVENTION

A first aspect of the present invention is a mode converter including a substrate including a first main surface and a second main surface, a first ground conductor layer formed on the first main surface, a second ground conductor layer formed on the second main surface, a plane circuit that is formed on the first main surface and propagates a high frequency; a pin that is connected to the plane circuit, is formed inside a through-hole which penetrate from the first main surface to the second main surface, and communicates with the first main face and the second main surface, and an anti-pad that is formed between an end portion of the pin exposed in the second main surface and the second ground conductor layer.

According to the mode converter of the first aspect, the end portion of the pin is exposed in the second main surface of the substrate and the anti-pad which electrically insulated from the ground conductor layer and an end portion of the pin is provided on the second main surface. Therefore, it is possible to easily confirm the positional relationship between the pin and the ground conductor layer and to adjust the position of the pin and the ground conductor layer (i.e. trimming).

A second aspect of the present invention is that, in the mode converter according to the first aspect, the pin is extended on the second main surface.

According to the mode converter of the second aspect, in the second main surface, the interface of the inner wall of the through-hole and the pin is not exposed. Therefore, it is possible to prevent fine particles from penetrating from the interface.

A third aspect of the present invention is that, in the mode converter according to the first aspect or the second aspect, the pin is formed along an inner wall of the through-hole and includes a cylindrical shape.

According to the mode converter of the third aspect, the pin has a cylindrical shape, and therefore, when the substrate is deformed by torsional stress or bending stress being applied, the pin can also be deformed easily following the substrate. Therefore, it is possible to prevent the mode converter from being damaged by excessive stress being applied.

A fourth aspect of the present invention is that, in the mode converter according to any one of the first to the third aspects, the anti-pad includes a circular ring shape.

A fifth aspect of the present invention is that, in the mode converter according to the fourth aspect, in the anti-pad including the circular ring shape, a difference of an outer diameter and an inner diameter is 40 to 80 μm.

A sixth aspect of the present invention is that, in the mode converter according to the fourth aspect, a dielectric material is filled in the through-hole.

A seventh aspect of the present invention is that, in the mode converter according to the sixth aspect, in the anti-pad including the circular ring shape, a difference of an outer diameter and an inner diameter is 50 to 80 μm.

A eighth aspect of the present invention is that, in the mode converter according to any one of the first to the third aspects, the anti-pad includes a rectangular ring shape.

A ninth aspect of the present invention is that, in the mode converter according to the eighth aspect, a dielectric material is filled in the through-hole.

A tenth aspect of the present invention is that, in the mode converter according to the eighth aspect or the ninth aspect, in the anti-pad including a rectangular ring shape, a length between an outer side and an inner side of the rectangular ring shape is 40 to 120 μm.

According to the mode converter having a shape of the anti-pad as in the fourth to tenth aspects, it is possible to control the reflection loss in the pins, and in particular, to control the impedance of the pin to match the impedance of the plane circuit.

According to the aspects of the present invention described above, the end portion of the pin is exposed in the second main surface of the substrate and the anti-pad which is electrically insulated from the ground conductor layer and an end portion of the pin is provided on the second main surface. Therefore, it is possible to easily confirm the positional relationship between the pin and the ground conductor layer and to adjust the position of the pin and the ground conductor layer (i.e. trimming).

In addition, conventionally, a through-hole is formed by using drilling. However, according to the aspects of the present invention described above, since it is possible to form a through-hole by a single piercing process, it is possible to improve the efficiency of operation processes and to improve the operation reliability and the yield.

According to the aspects of the present invention described above, since it is possible to form a through-hole at once in the first substrate and the second substrate, as compared to the case of performing the piercing operation separately in the two substrates, an alignment of the through-holes of the respective substrates is not required. Therefore, there is no positional displacement between the through-holes, and it is possible to reduce the deterioration of transmission characteristics caused by the positional displacement. In addition, the positional relationship between the ground conductor layer and the end of the pin can be easily checked.

According to the aspects of the present invention described above, since the positions and the diameter of the excitation pins are determined uniformly in the substrate, it is possible to reduce degradation of the transmission characteristics.

According to the aspects of the present invention described above, since the through-hole which penetrates from the first main surface to the second main surface is formed in the substrate, control in the height direction of the through-hole becomes unnecessary and the mode converter can be easily manufactured.

DETAILED DESCRIPTION OF THE PREFERRED EMBODIMENTS

Hereinbelow, the present invention is described with reference to the drawings based on the preferred exemplary embodiments. Note that the preferred exemplary embodiments hereinbelow are described more concretely to ensure the better understanding of the present invention by using examples, and do not limit the present invention unless otherwise indicated. In addition, regarding the drawings used in the descriptions below, main portions may be enlarged for convenience in order to clearly show the features of the present invention, and therefore, a size, a proportion and the like of each structural member are not necessarily the same as the ones of the actual members. Like features in different drawing figures are represented by the same reference numbers, and duplicative descriptions thereof may be omitted.

Configuration of Mode Converter

Figure 1:
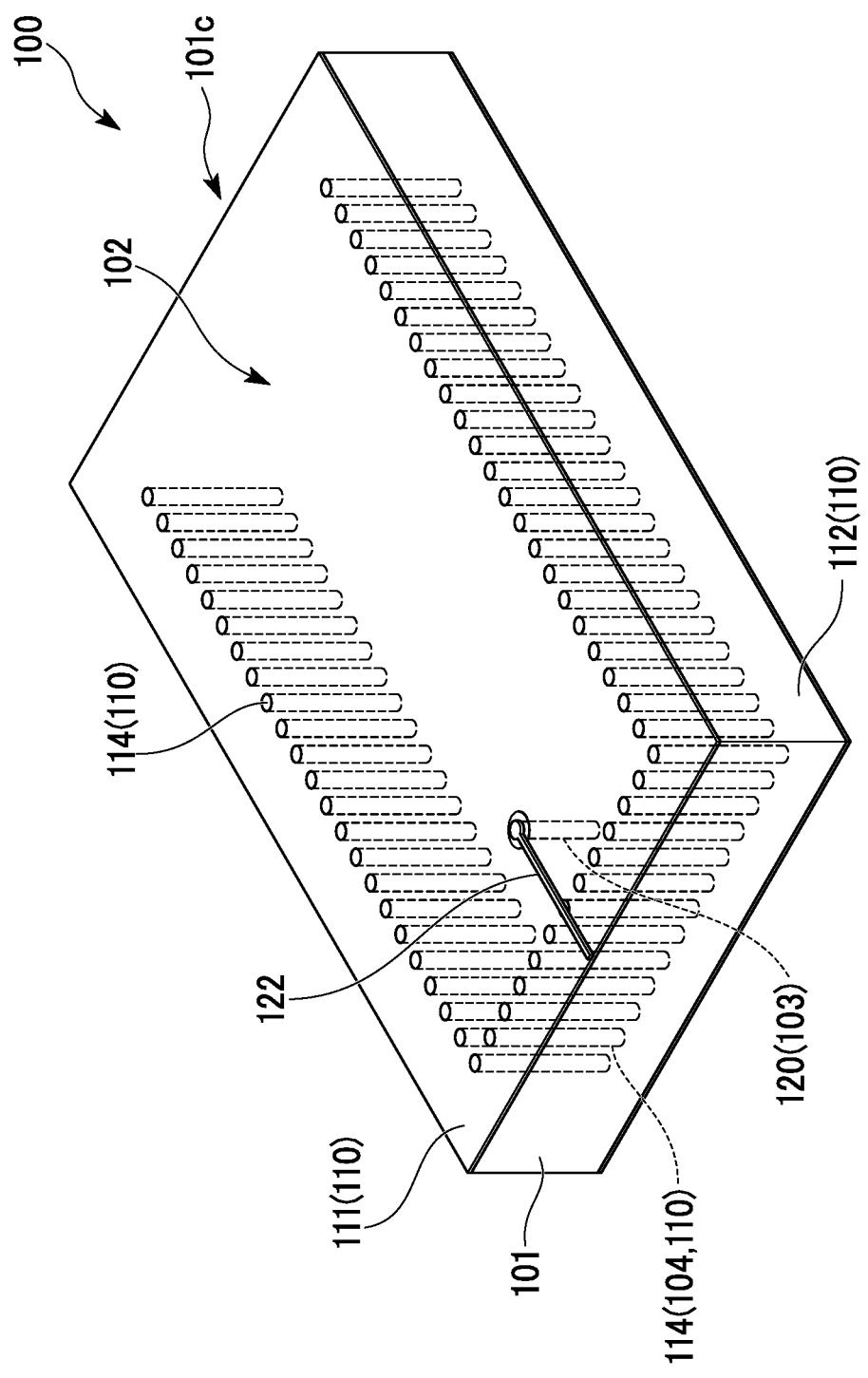
FIG. 1 is a perspective view schematically showing a configuration of a mode converter according to an exemplary embodiment of the present invention.
Figure 2:
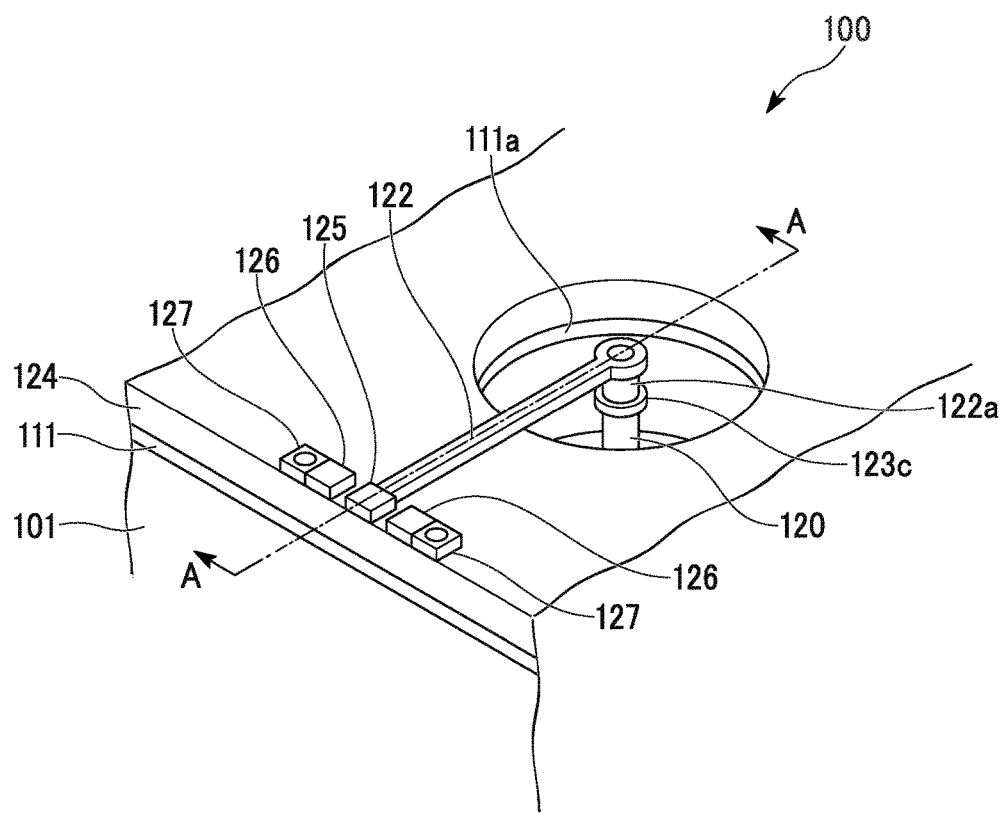
FIG. 2 is a perspective view schematically showing an enlarged configuration of a transmission path of a mode converter according to an exemplary embodiment of the present invention.
Figure 3:
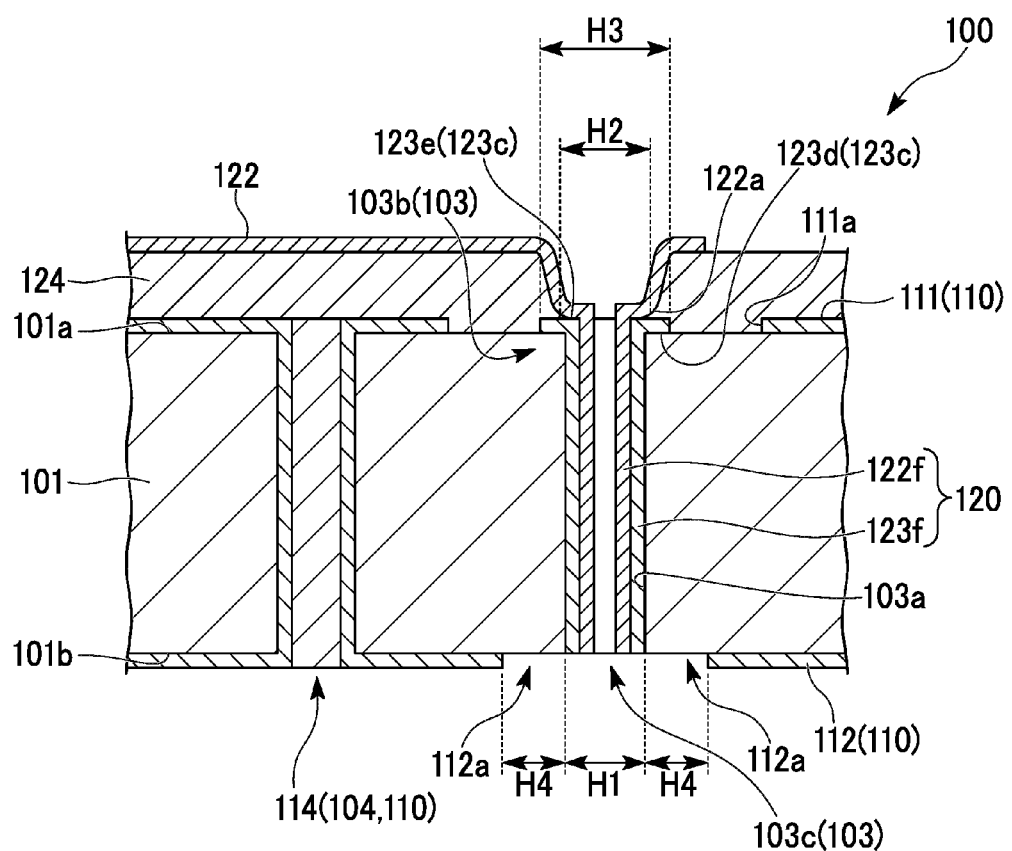
FIG. 3 is a cross-sectional view schematically showing an example of a configuration of a mode converter according to an exemplary embodiment of the present invention.

A configuration of a mode converter 100 according to one exemplary embodiment of the present invention is described with reference to FIGS. 1-3. FIG. 1 is a perspective view schematically showing the configuration of the mode converter 100. FIG. 2 is a perspective view schematically showing an enlarged configuration of a transmission path 122 of the mode converter 100. FIG. 3 is a cross-sectional view taken along an A-A line in FIG. 2 and schematically showing an example of the configuration of the mode converter 100.

As shown in FIGS. 1-3, the mode converter 100 includes a substrate 101, a plane circuit (transmission line) 122 for the high-frequency signal propagation, a pin (conductive pin, excitation pin, or stimulus pin) 120, a ground conductor layer (conductive film) 111 connected to the ground, a ground conductor layer (conductor film) 112 (FIGS. 1 and 3), and a waveguide 110 (FIGS. 1 and 3).

The substrate 101 is a layered substrate formed by a single member or stacking a plurality of substrates, and as shown in FIG. 1, the substrate 101 includes single first through-hole (through-hole) 103 and a plurality of the second through-holes 104 that penetrate from a main surface (first main surface) to another main surface (second main surface). The second through-hole 104 is positioned so as to surround the first through-hole 103 in a U-shape in a plan view of the substrate 101.

As shown in FIG. 3, the pin 120 is configured such that a conductive film 123f and a conductive film 122f are stacked in this order on an inner wall surface 103a of the first through-hole 103 which penetrates from the main surface 101a of the substrate to another main surface 101b. Through the first through-hole 103, the pin 120 is in communication with both the main surfaces 101a and 101b of the substrate. The conductor film 122f is a film that is extended from the plane circuit 122.

The waveguide 110 includes ground conductor layers 111, 112 respectively disposed on the main surface 101a and another main surface 101b of the first substrate (substrate), and a plurality of conductor columns (posts) 114 erected between the ground conductor layers 111, 112 and connecting both columns. The conductor column 114 is formed of a second through-hole 104 and a conductor disposed therein. Both ends of the conductor columns 114 are electrically connected to the ground conductor layers 111, 112, respectively.

As shown in FIG. 1, the plurality of conductive columns 114 is disposed so as to surround the pin 120 in a U-shape in a plan view of the first substrate 101. In addition, at the end 101c of a side surface of the first substrate 101, the conductor columns 114 and the conductive film are not provided, and an opening portion 102 into which the electromagnetic wave is emitted is formed. When operating the mode converter 100, the conductor columns 114 confine the electromagnetic wave emitted from the pin 120 in the waveguide 110. It is possible that, by providing the conductor columns 114, the emitted electromagnetic wave is propagated only in a desired direction without causing leakage of the emitted electromagnetic wave.

Figure 7:
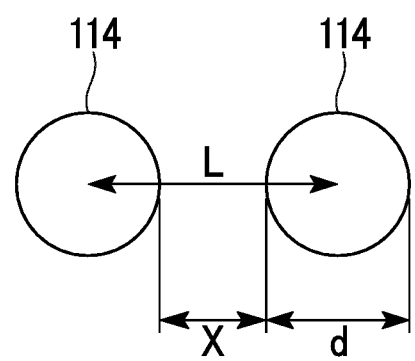
FIG. 7 is a cross-sectional view schematically showing an arrangement of conductor columns that constitutes a mode converter according to an exemplary embodiment of the present invention.

In the plan view of the first substrate 101, among edges of the peripheral portion forming substantially a rectangular shape, the plurality of conductor columns 114 are arranged in parallel to three edges other than an edge corresponding to the opening 102. The plurality of conductor columns 114 are arranged so as to prevent the electromagnetic waves from being emitted from the mode converter by reflecting the electromagnetic waves emitted from the pin 120. In particular, when the adjacent conductor columns 114 are arranged to have a space therebetween, as shown in FIG. 7, a distance L between the center axes of the conductor columns 114 is determined to be smaller than 2 times the diameter d of the conductive column 114. That is, the distance X between the nearest positions of the conductor columns 114 is determined to be smaller than the diameter d of the conductive column 114.

In FIG. 3, each of the grounding conductor layers 111, 112 is configured by a conductor such as copper, and is a film that functions as a wiring which is electrically grounded (GND). The ground conductor layer 111 is not provided at the periphery of the opening portion 103b of the first through-hole in the main surface 101a of the first substrate. An area where the ground conductor layer 111 is not provided and the pins 120 and the ground conductor layer 111 are insulated is an anti-pad 111a. Similarly in another main surface 101b of the first substrate, the ground conductor layer 112 is not provided at the periphery of the opening portion 103c of the first through-hole, and an area where the ground conductor layer 112 is not provided is an anti-pad 112a having the predetermined width H4.

The anti-pad 111a is defined as an insulation region which extends outward from the opening portion 103b of the first through-hole in the main surface 101a of the first substrate. In another main surface 101b of the first substrate, the anti-pad 112a is defined as an insulation region which extends outward from the opening portion 103c of the first through-hole and on which nothing is disposed. The region where the anti-pad 111a and the anti-pad 112a are formed may be an electrically insulated region such as a region where an insulating material is disposed. For instance, the ground conductor layers 111, 112 and the anti-pads 111a, 112a may be coated with the insulating portion 124 formed on another main surface 101a of the first substrate or an insulating portion (not shown, also referred to as a passivation) formed on another main surface 101b of the first substrate. Since the insulating portion is formed, the ground conductor layers 111, 112 and the anti-pads 111a, 112a are protected from contamination or adhesion of foreign matter. In addition, it is possible to laminate another substrate so as to contact directly with the mode converter 100.

In FIG. 2, the insulation portion 124 having substantially uniform thickness is laminated on the conductive film 111 and the transmission line 122 is formed on an outer surface of the insulation portion 124. The transmission line 122 is provided so as to overlap at least the anti-pad 111a. One end of the transmission line 122 is connected to an external end of the pin 120 and the other end thereof is connected to a GSG pad 125 on the insulation portion 124 so that the transmission line 122 forms a micro-strip line.

Figure 6:
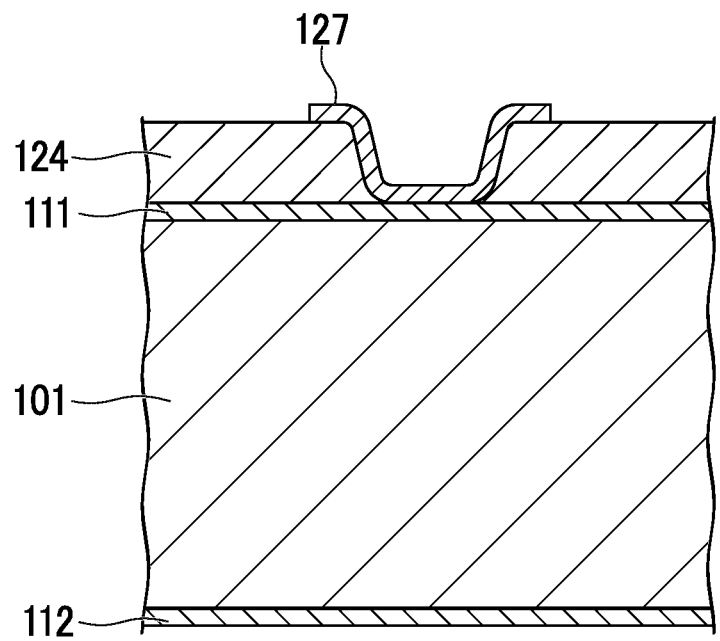
FIG. 6 is a cross-sectional view schematically showing a configuration of a vicinity of a ground (GND) via of a mode converter according to an exemplary embodiment of the present invention

As shown in FIG. 2, at both outer sides of the GSG pad 125 and on both sides of the transmission line 122 of the insulating portion 124. GND pads 126 are arranged separately. At outer sides of both GND pads 126, as shown in FIG. 2, GND connection vias 127 are adjacent. As shown in FIG. 6, the GND connection via 127 is formed so as to connect and be contact with a top surface of the insulation portion 124 and the conductive film 111.

In the pin 120, at least a surface thereof may be formed of a conductor such as Cu, Ag, and Au, and the structure of an inside of the pin 120 may be occupied by a conductor similar to the surface, a cavity, an insulating resin or the like. The insulating resin may have an electrical conductivity of 0.1 S/m or less compared to that of the anti-pads 111a, 112a.

As shown in FIG. 3, the pin 120 is formed along the inner wall 103a of the first through-hole and has a cylindrical shape with an outer diameter of H. Therefore, when the substrate 101 is deformed by torsional stress or bending stress being applied, the pin 120 can also be deformed easily following the substrate 101, and it is possible to prevent the mode converter 100 from being damaged by the excessive stress being applied.

The pin 120 is formed vertically with respect to both the main surfaces (101a. 101b) of the first substrate 101. At the end portion of the pin 120 at the main surface 101a of the first substrate 101, lands 123c are arranged circumferentially, which are at the same layer-level as the ground conductor layer 111, are made of the same material as the ground conductor layer 111, and have a flange shape. In the surface of the land 123c to which has an annular shape in a plan view of the first substrate 101, the outer edge portion 123d is covered with the insulating portion 124. The surface of the annular portion 123e closer to the center of the land 123c is covered with a conductor 122a whose diameter increases in the thickness direction of the insulating portion 124 and which is extended from the transmission line 122.

As shown in FIG. 3, the outer diameter H3 of the outer edge portion 123d (the outer diameter of the land 123c), the outer diameter H2 of a portion connected to the land 123c of the conductor 122a and the outer diameter H1 of the pin 120 are determined to be H3>H2>H1.

The plane circuit 122, the pin 120, the ground conductor layers 111, 112, and the conductor constituting the conductor column 114 as described above are formed so as to stack a film made of titanium (Ti) or chromium (Cr) and a film made of copper (Cu) in this order from a surface of the first substrate 101 or the resin 124. These conductors can be formed using a plating method or a conductive paste.

Figure 4:
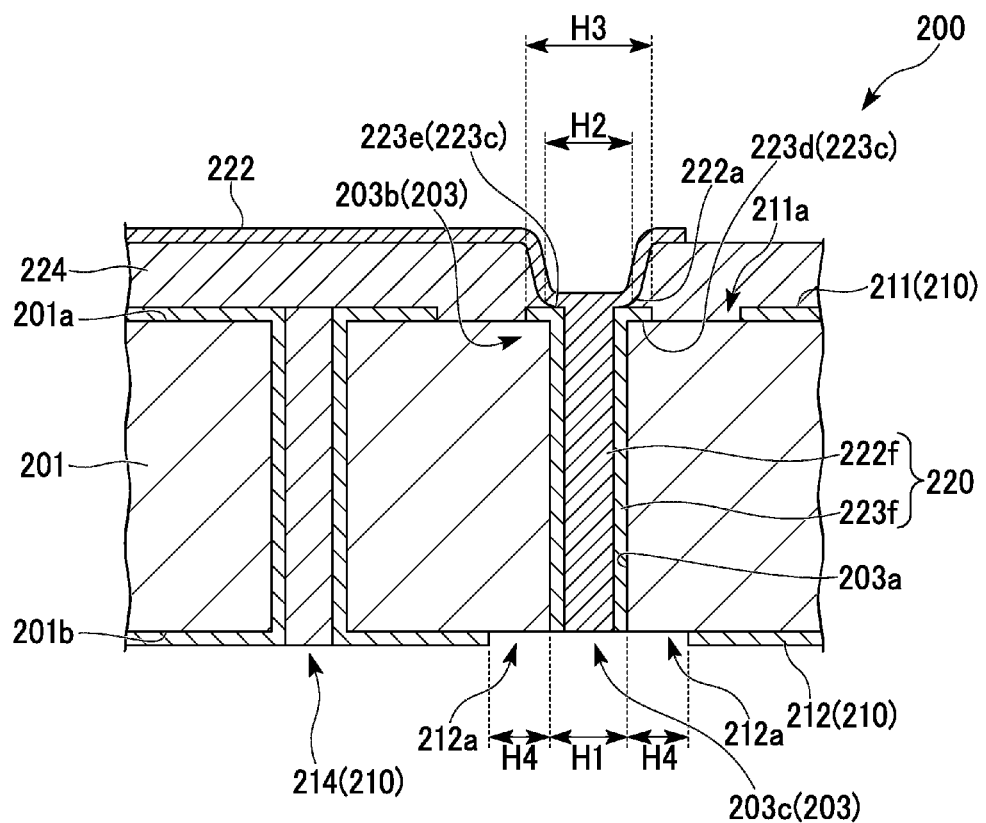
FIG. 4 is a cross-sectional view schematically showing another example of a configuration of a mode converter according to an exemplary embodiment of the present invention.

FIG. 4 is a cross-sectional view of a mode converter 200 taken along an A-A line shown in FIG. 2 and shows another example of a configuration of the mode converter 100 shown in FIG. 3. In FIG. 3, an example is shown in which the vicinity of the center axis in the longitudinal direction of the first through-hole 103 is hollow. However, as shown in FIG. 4, the inside of the first through-hole 203 may be filled with the conductor 222f, 223f constituting the pins 220. Components 201, 201a. 201b, 210, 211, 211a, 212, 212a, 214, 222, 222f. 223, 223c. 223d, 223e, and 223f, except for the first through-hole 203, respectively correspond to and are the same as components 101, 101a, 101b, 110, 111, 111a, 112, 112a, 114, 122, 122f. 123, 123c, 123d, 123e, and 123f, of the mode converter 100 in FIG. 3. The first through-hole 203 includes an inner wall surface 203a and the opening portions 203b and 203c. In the surface of the land 223c which has an annular shape in a plan view of the first substrate 201, the outer edge portion 223d is covered with the insulating portion 224. The surface of the annular portion 223c closer to the center of the land 223c is covered with a conductor 222a whose diameter increases in the thickness direction of the insulating portion 224 and which is extended from the transmission line 222.

Figure 5:
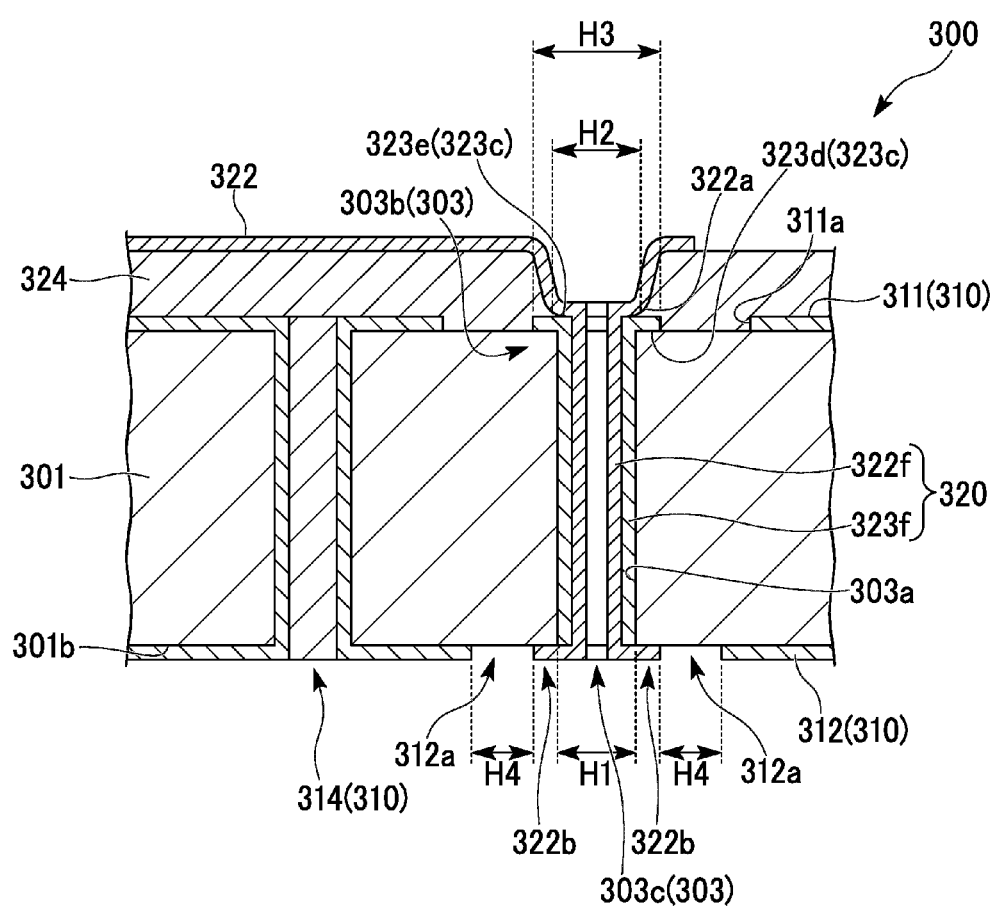
FIG. 5 is a cross-sectional view schematically showing another example of a configuration of a mode converter according to an exemplary embodiment of the present invention.

FIG. 5 is a cross-sectional view of a mode converter 300 taken along an A-A line shown in FIG. 2 and shows another example of a configuration of the mode converter 100 shown in FIG. 3. In FIG. 3, an example shown is that the pin 120 is formed along the inner wall 103a of the first through-hole, and the exposed surface of the pin 120 that is exposed on another main surface 101b of the first substrate is formed in the same plane as another main surface 101b of the first substrate. However, as shown in FIG. 5, the pin 320 may be further extended on another main surface 301b of the first substrate. That is, the pin 320 may have an edge portion (land) 322b extending outwardly at the opening portion 303c of the first through-hole. Components 301, 301b, 303, 303a, 303b, 303c, 310, 311, 311a, 312, 312a, 314, 320, 322, 322a, 322b, 322f, 323c, 323d, 323e, 323f, and 324, respectively correspond to components 101, 101b, 103, 103a, 103b, 103c, 110, 111, 111a, 112, 112a, 114, 120, 122, 122a, 122b, 122f, 123c, 123d, 123e, 123f, and 124 of FIG. 1.

By employing the configuration described above, in another main surface 301b of the first substrate, the interface of the inner wall 303a of the first through-hole and the pin 320 is not exposed. Therefore, it is possible to prevent fine particles and the like from entering from the interface.

As described above, according to the mode converter according to the present exemplary embodiment, the ground conductor layer disposed on another main surface of the first substrate serves as a ground terminal (GND). Therefore, at another main surface of the first substrate, the end portion of the pin is subjected to electric-field coupling with the ground conductor layer, and the impedance of the pin varies according to a distance between the ground conductor layer and the end portion of the pin, that is, the size of the anti-pad. Therefore, the impedance of the pin can be controlled so as to match the impedance of the plane circuit by adjusting the size of the anti-pad.

The operation of the mode converter is described using, for example, FIG. 3. In the mode converter, a mode of the electric field is converted such that a mode between the transmission path 122 forming a microstrip line and the conductive film 111 forming a GND is a TEM mode, and a mode propagated inside the waveguide 110 is a TE mode.

Figure 34:
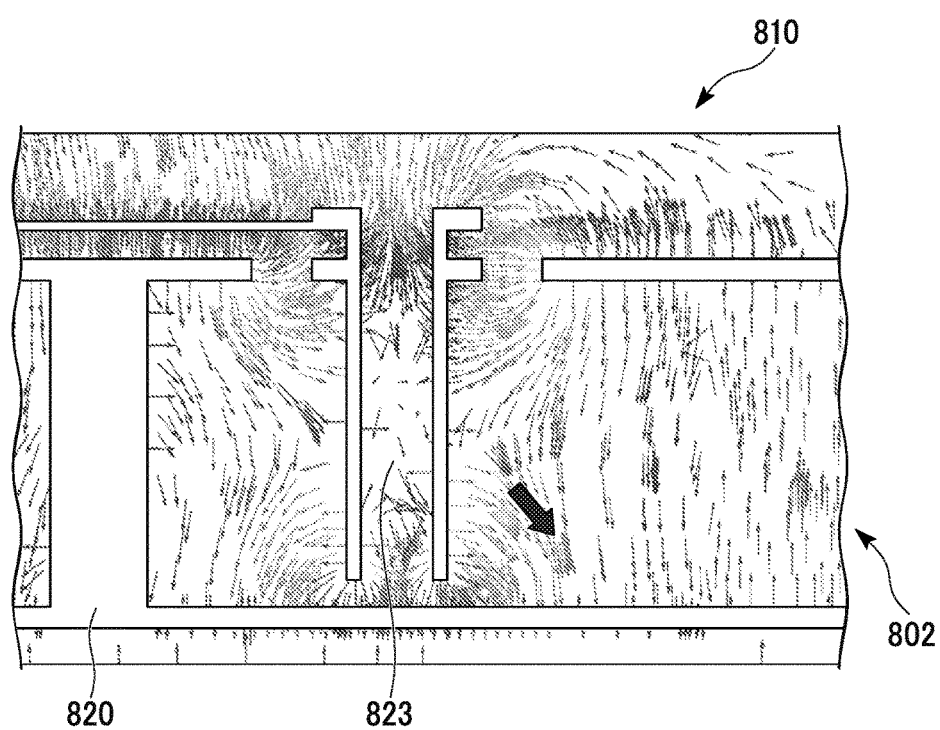
FIG. 34 is a cross-sectional view schematically showing electric field vectors in a mode converter of the prior art.
Figure 35:
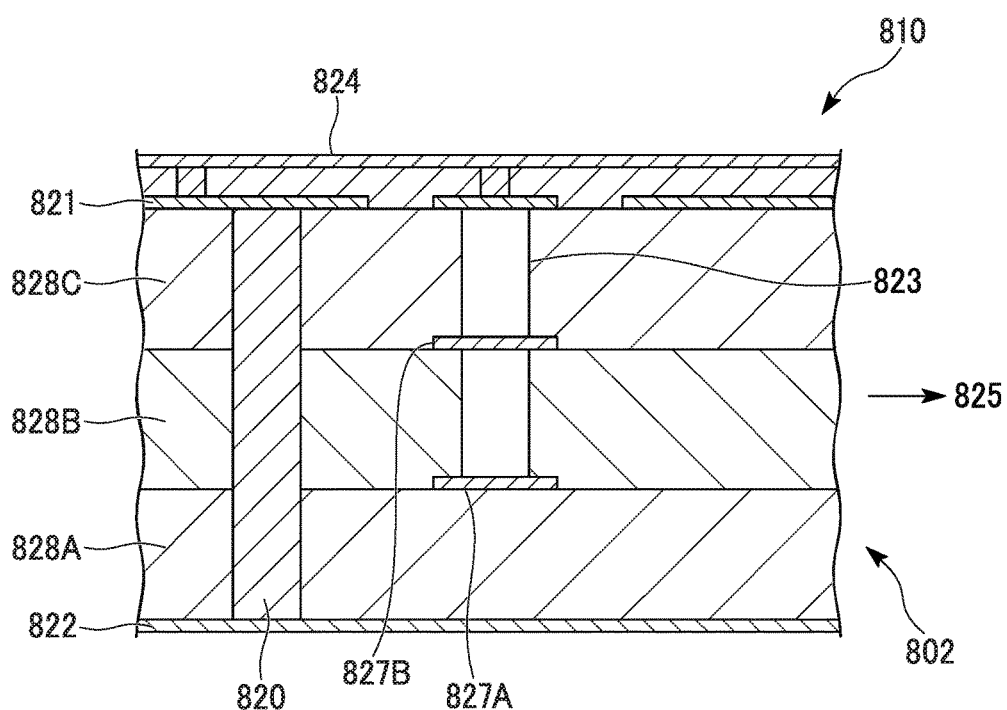
FIG. 35 is a cross-sectional view schematically showing a configuration of a mode converter of the prior art.

In the configuration of the conventional example of FIG. 35, since the pin 823 does not penetrate through the substrate, an electric field in the thickness direction of the substrate (an electric field having vertical components) is generated between the ground conductor layer and the conductor (see FIG. 34). By the vertical electric field, an electric field in an oblique direction (indicated by the arrows in FIG. 34) having the vertical components is generated, and therefore, the TE mode at the front end surface (i.e., a right side in FIGS. 34 and 35) is induced. Accordingly, a mode conversion of the electric field is performed.

Figure 33:
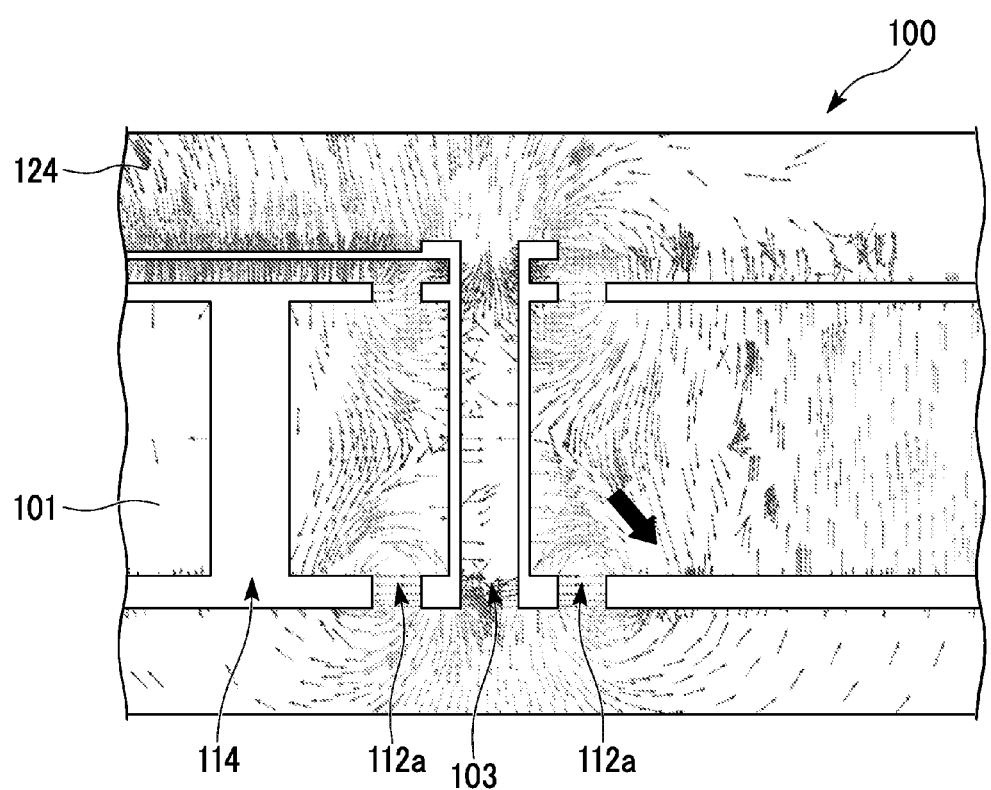
FIG. 33 is a cross-sectional view schematically showing an electric field distribution in a mode converter of an exemplary embodiment of the present invention.

On the other hand, in the configuration of the present application, as shown in FIG. 3 for example, the anti-pad 112a and the through-hole 103 penetrating the substrate 101 are formed. In the anti-pad 112a, an electric field in a vertical direction with respect to the thickness direction of the substrate (an electric field having transverse components) is generated (see FIG. 33). However, in the periphery of the anti-pad 112a and the periphery of the through-hole 103, an electric field in an oblique direction (indicated by the arrows in FIG. 33) having the vertical components is generated. By the electric field in an oblique direction having the vertical components, the TE mode at the front end surface (i.e., a right side in FIGS. 3 and 33) is induced. Therefore, as described in the present application, even if the configuration is provided with the anti-pad 112a and the through-hole 103, it is operable as a mode converter.

In addition, according to the mode converter according to the present exemplary embodiment, the end portion of the pin is exposed in another main surface of the first substrate, the anti-pad to electrically insulate the ground conductor layer and an end portion of the pin, and is provided on another main surface of the substrate. Therefore, it is possible to easily confirm the positional relationship between the ground conductor layer and an end portion of the pin. Furthermore, by performing an adjustment (trimming) and an optimization while confirming the size of the anti-pad, the transmission line where input impedance is matched can be easily realized.

Since it is an easy process to adjust the size of the anti-pad and a fine adjustment is possible, the input impedance of the pin and the plane circuit can be precisely matched. Therefore, reflection loss of the signals propagated to the pin from the plane circuit can be precisely controlled by adjusting the size of the anti-pad. Furthermore, by optimizing the size of the anti-pad, it is possible to significantly reduce the reflection loss.

Method of Manufacturing Mode Converter

An example of a method of manufacturing the mode converter 100 shown in FIG. 1 is described with reference to FIGS. 8A-8M. FIGS. 8A-8M are drawings of a cross section of an essential portion at the stage of the manufacturing process of the mode converter 100, and the cross sections are shown step by step in the order of the manufacturing process.

Figure 8A:
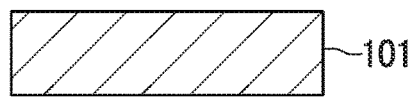
FIG. 8A is a drawing describing a method of manufacturing a mode converter according to an exemplary embodiment of the present invention.

First, as shown in FIG. 8A, as a preparation process, the first substrate 101 made of glass and the like having transparency such that a laser described below is transmittable is prepared. The thickness of the first substrate is approximately 850 μm.

Figure 8B:
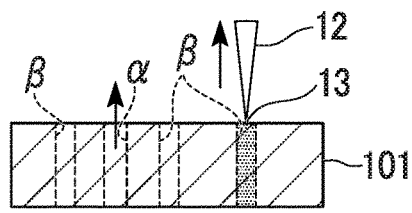
FIG. 8B is a drawing describing a method of manufacturing a mode converter according to an exemplary embodiment of the present invention.

Next, as shown in FIG. 8B, as the second process, a modified region α and a modified region β are formed by irradiating a predetermined position of the first substrate 101 with a laser.

The modified region α is formed from the main surface to another main surface of the first substrate at positions where the pins inside the first substrate 101 are formed, that is, the modified region α is formed in a region which has a length equal to the thickness of the first substrate 101.

The modified region 3 is formed from the main surface to another main surface of the first substrate at positions where the conductor columns of the first substrate are formed, that is, the modified region 3 is formed in a region which has a length equal to the thickness of the first substrate 101.

The modified region 3 has a diameter d and is formed such that a distance X between the adjacent modified regions 13 is smaller than the diameter d as shown in FIG. 7. For example, the first substrate 101 may be formed by Pyrex® (registered trademark), and the modified portions are formed by beam irradiation of a femtosecond laser having a pulse width of 250 fs as the laser beam. The size of the modified regions α and β described above are controlled by the conditions of laser irradiation.

A laser irradiation method in the first process is described. A portion to be modified of the first substrate 101 is irradiated with a laser beam 12 and is scanned by a focal point 13 of the laser beam 12. At this time, with the progress of the modifying process, the portion is scanned by the focal point 13 of the laser beam 12 such that at least a portion of the laser beam 12 reaching the focal point 13 does not propagate the modified regions formed above, i.e., the regions which are modified by the irradiation of the laser beam 12. In particular, the modified regions α, β are formed inside of the first substrate 101 by the scanning of the focal point 13 of the laser beam 12 in a direction of the arrow shown in FIG. 8B. In addition, it is desirable that the laser beam 12 is irradiated in succession from the surface to the inside of the first substrate 101, i.e., from the main surface toward another main surface.

Generally, the modified regions formed using a laser beam have a higher refractive index than that of the first substrate 101. However, since a refractive index distribution of the modified regions and the vicinity thereof is slightly non-uniform, the light propagating in the modified regions is reflected and refracted randomly. Therefore, in the inside of the first substrate 101, since the laser beam 12 does not propagate through the modified regions before being transmitted to a condensing unit, the beam diameter can be prevented from spreading out and the decrease of a peak intensity can be reduced. Furthermore, since at least a portion of the laser beam 12 does not propagate through the modified portion 14, it is possible to quickly form a region to be modified by the irradiation of the laser beam 12.

Figure 8C:
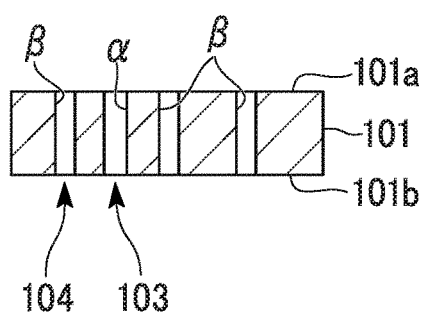
FIG. 8C is a drawing describing a method of manufacturing a mode converter according to an exemplary embodiment of the present invention.

Then, as shown in FIG. 8C, as the second process, the modified region α and the modified region β are removed by etching. The etching is performed by immersing the glass substrate 101 where the modified regions α, β are formed into predetermined chemical accommodated in a container (not shown). Therefore, the modified region α and the modified region β are wet-etched by the chemical from both sides 101a and 101b of the glass substrate 101, and are removed from the inside of the glass substrate 101.

As a result, as shown in FIG. 8C, at portions where the modified region α and the modified region β are present, the first through-hole 103 and the second through-hole 104 are respectively formed. In the present exemplary embodiment, as the chemical, an acid solution including hydrofluoric acid as a main component or an acid solution including potassium hydroxide as a main component can be used.

The etching in the second process takes advantage of the phenomenon that a modified portion is etched very quickly compared to an unmodified portion. Therefore, it is possible to form the fine first through-hole 103 and the fine second through-hole 104 due to the respective shapes of the modified regions α, β. In the present exemplary embodiment, a hole diameter of the fine first through-hole 103 and the second through-hole 104 can be appropriately determined in the range of 10 to 300 μm in accordance with the use of the part to be produced.

Figure 8D:
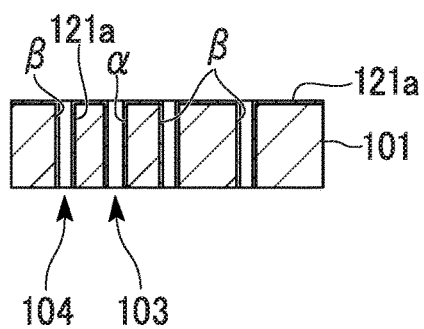
FIG. 8D is a drawing describing a method of manufacturing a mode converter according to an exemplary embodiment of the present invention.
Figure 8E:
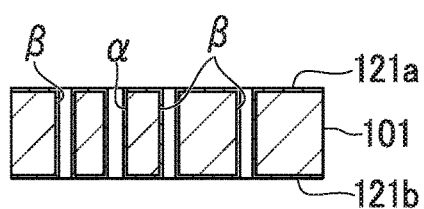
FIG. 8E is a drawing describing a method of manufacturing a mode converter according to an exemplary embodiment of the present invention.

Next, as the base formation process which is a pre-process of the third process, as shown in FIG. 8D, a seed layer 121a is formed on the main surface 101a (FIG. 8C) of the first substrate 101 and in the interior of the first through-hole 103 and the second through-hole 104, and as shown in FIG. 8E, the seed layer 121b is formed on another main surface 101b (FIG. 8C) of the first substrate 101. The seed layers 121a, 121b can be formed by sputtering and include a mixture of Cu and Cr, a mixture of Cu and Ti or the like, and it is desirable that the thickness is approximately 10 to 500 nm.

Figure 8F:
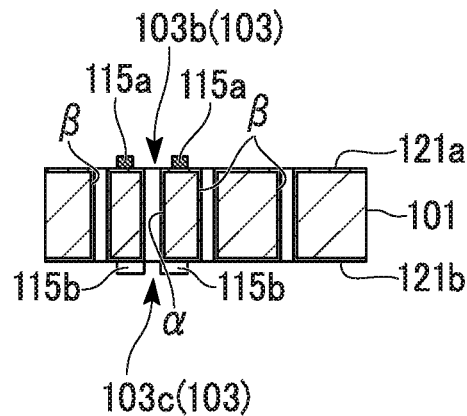
FIG. 8F is a drawing describing a method of manufacturing a mode converter according to an exemplary embodiment of the present invention.

Next, as a resist formation process which is a pre-process of the third process, as shown in FIG. 8F, a resist 115a is formed by plating around an area where a land is formed that is connected to the opening portion 103b of the first through-hole in the seed layer 121a. In addition, around an area that overlaps with the opening 103c of the first through-hole in the seed layer 121b, a resist 115b is formed by plating.

The resist 115a would be annular when viewed from the top of main surface 101a and formed to cover an area corresponding to the anti-pad 111a excluding the opening portion 103b of the first through-hole and the land 123c. In addition, the resist 115b would be annular (when viewed from the bottom of main surface 101b) and formed to cover an area corresponding to the anti-pad 112a excluding the opening portion 103c of the first through-hole. An inner diameter H3 of the resist 115a is determined in consideration of an outer diameter H3 of the land 123c. As the resists 115a, 115b, for example, a liquid negative resist, a film-like to negative resist, a liquid positive resist, and a film-like positive resist can be used.

Figure 8G:
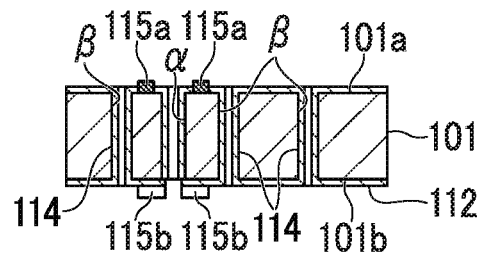
FIG. 8G is a drawing describing a method of manufacturing a mode converter according to an exemplary embodiment of the present invention.

Then, copper plating is performed as the third process, as shown in FIG. 8D. A plate layer is grown on the surface of the seed layers 121a, 121b other than a portion covered with the resist 115a, as shown in FIGS. 8F and 8G. Hereinbelow, a plate layer formed on the main surface 101a of the first substrate is referred to as a ground conductor layer 111, a plate layer formed on another main surface 101b is referred to as a ground conductor layer 112, a plate layer formed inside the first through-hole 103 is referred to as a pin 120, and a plate layer formed inside the second through-hole 104 is referred to as a conductor column 114.

The thickness of the plating layer is preferably thicker than at least a skin depth due to the signal of the millimeter-wave band. Since the skin depth due to the signal of 60 GHz is 270 nm, the thickness is considered to be sufficient if it is approximately 2 μm. Here, the pin 120 formed by copper plating and the conductor column 114 may not be completely filled inside the first through-hole 103 and the second through-hole 104, respectively. However, when airtightness is required and the like, it is desirable to be completely filled.

Figure 8H:
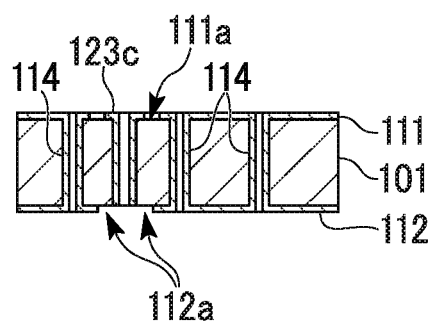
FIG. 8H is a drawing describing a method of manufacturing a mode converter according to an exemplary embodiment of the present invention.

Next, as a resist peeling process, as shown in FIG. 8H, the resists 115a, 115b applied in FIG. 8G are peeled and the remaining seed layers 121a, 112b are etched. Accordingly, the conductive film 111, the land 123c, and the anti-pads 111a, 112a are formed.

Figure 8I:
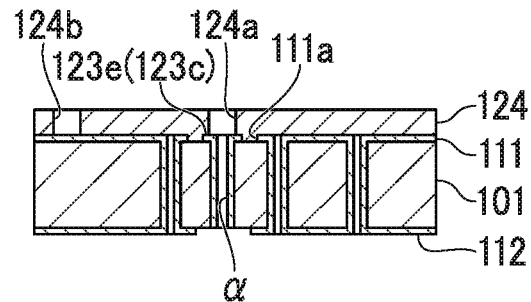
FIG. 8I is a drawing describing a method of manufacturing a mode converter according to an exemplary embodiment of the present invention.

Then, as the fourth process shown in FIG. 8I, an insulating portion 124 is formed on the outer peripheral portion of the conductive film 111 and the land 123c. The insulating portion 124 forms opening portions 124a, 124b. The opening portion 124a includes a portion formed by an opening portion of the first through-hole α and an annular portion 123e near the center of the land 123c surrounding the opening portion of the first through-hole α. The opening portion 124b is formed by removing a portion which overlaps a portion to be the GND connection via at an end portion of the plane circuit (transmission line). At the opening portion around the first through-hole 103, it is determined that the outer diameter is to be H2 (see e.g. FIG. 3), and as shown in FIG. 2, the outer diameter of a portion of the conductor 122a that is connected to the land 123c is determined.

The insulating portion 124 formed in the fourth process is made of a photosensitive resin, and for example, the resin in a liquid state is applied, by spin coating, to the conductive film 111 and a portion of the surface 111a of the glass substrate that corresponds to the opening portion. Next, when curing the applied photosensitive resin layer, the opening 124a around the first through-hole 103 and an opening 124b serving as the GND via is removed by photolithography to form an insulating portion 124.

When the resin removal process using photolithography is performed, if a photosensitive resin residue which cannot be removed only by the development on the annular portion 123e in the opening 124a is generated, implementation of a Reactive Ion Etching (RIE) process by $CF_4$ gas or $O_2$ gas is very effective.

Figure 8J:
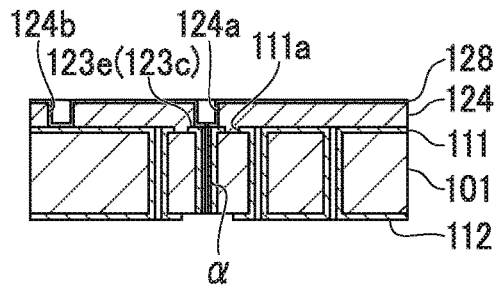
FIG. 8J is a drawing describing a method of manufacturing a mode converter according to an exemplary embodiment of the present invention.
Figure 8K:
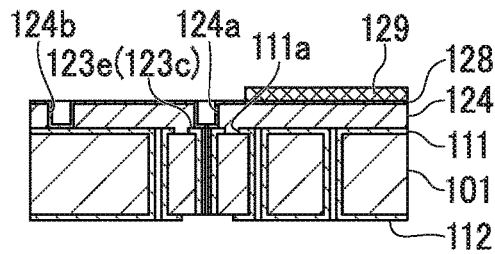
FIG. 8K is a drawing describing a method of manufacturing a mode converter according to an exemplary embodiment of the present invention.

Then, as a base formation process is a pre-process of the transmission line formation process, as shown in FIG. 8J, the seed layer 128 is formed at the surface of the insulating portion 124, the inside of the annular portion 123e of the land 123c and hole α, and the inside of the opening portion 124b. The seed layer 128 can be formed by sputtering in the same manner as forming the seed layer 121a, 121b, may include a mixture of Cu and Cr, a mixture of Cu and Ti, and the like, and may have a thickness of approximately 10-500 nm.

Figure 8L:
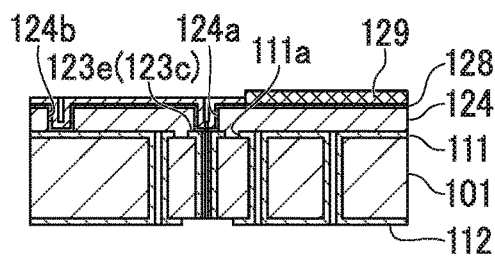
FIG. 8L is a drawing describing a method of manufacturing a mode converter according to an exemplary embodiment of the present invention.

Then, as a resist formation process which is a pre-process of the transmission line formation process, as shown in FIG. 8L, the seed layer 128 other than a portion where the transmission line is formed, and a resist 129 is formed by plating. As shown in FIG. 8L, a resist 129 is formed so as to cover a region excluding a portion to be the transmission line, and portions where a GSG pad (not shown), a GND pad (not shown), and a GND vias (not shown) are formed. A material of the resist material may be a material similar to the resists 115a, 115b.

Figure 8M:
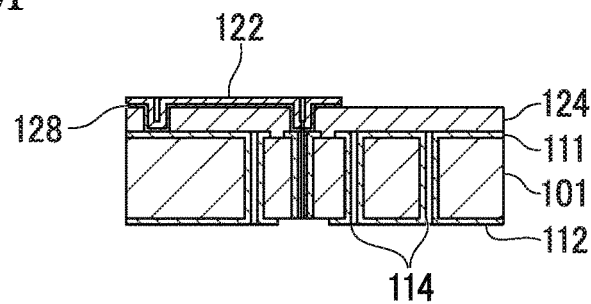
FIG. 8M is a drawing describing a method of manufacturing a mode converter according to an exemplary embodiment of the present invention.

Next, as a resist peeling process, as shown in FIG. 8M, the resist is peeled and the remaining seed layer 128 is etched. Accordingly, a transmission line 122 which forms a microstrip line is formed.

Through the processes described above, a mode converter shown in FIGS. 1-3 can be obtained. When forming the first through-hole and the second through-hole using a laser as described above, members constituting the first substrate are limited to glass and the like having transparency that a laser beam is transmittable. However, the first through-hole and the second through-hole can be formed by mechanical processing such to as dry etching, a drill or the like, and members constituting the first substrate are not limited. In addition, on another main surface 101b of the first substrate, a passivation film which coats the ground conductor layer 112 and the anti-pad 112a may be formed. Since the insulating portion is formed, the ground conductor layers 111, 112 and the anti-pads 111a, 112a are protected from contamination or adhesion of foreign matter. In addition, it is possible to laminate another substrate so as to contact directly with the mode converter 100. As the passivation film, for example, the insulating resin, for example, polyimide, a silicone resin, and the like can be used.

As described above, according to the method of manufacturing the mode converter according to the present exemplary embodiment, it is possible to adjust the input impedance of the pin based on the size of the anti-pad provided on another main surface of the substrate. Therefore, the first through-hole having a pin may penetrate through at least the first substrate, and without adjusting the length of the hole, other circuit elements, or the like, it is possible to realize signal transmission where the reflection loss is reduced to match the impedance.

In addition, according to the method of manufacturing the mode converter according to the present exemplary embodiment, the anti-pad is a portion which is exposed toward the outside of the mode converter. Therefore, a fine adjustment of the size of the anti-pad can be performed with visual inspection. Also, even after the mode converter is completed, the size of the anti-pad can be readjusted easily.

In addition, according to the method of manufacturing the mode converter according to the present exemplary embodiment, as the first substrate, it is possible to use a substrate made of a single base material instead of a substrate where a plurality of base materials are laminated. By using a single base material as the first substrate, when stacking a plurality of base materials, it is possible to avoid any undesirable conditions such as loss due to an adhesive, variations in the characteristics of each layer, and shifts of the stacked layers.

In the exemplary embodiment described above, as shown in FIG. 3, the diameter of the pin 120 is uniform from the end portion at the main surface 101a of the first substrate to the end portion at another main surface 101b.

Figure 9:
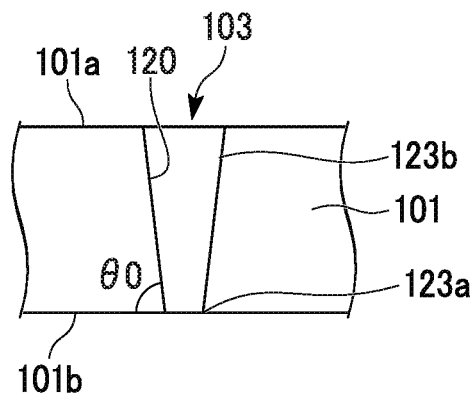
FIG. 9 is a cross-sectional view schematically showing an example of a shape of a pin which configures a mode converter according to an exemplary embodiment of the present invention.

However, as shown in FIG. 9, a diameter of the end portion 123b at another main surface 101b of the first substrate can be greater than a diameter of the end portion 123a of the main surface 101a side, and an angle made by a sidewall surface of the first through-hole 103 and the main surface 101a of the first substrate can be θ0. In this case, since the metal is adhered effectively in the inside of the first through-hole 103 when the film formation and processing is performed from the end portion 123b side, it is possible to reliably form the seed layer 121a and the conductor layer 111 by copper plating.

Figure 10:
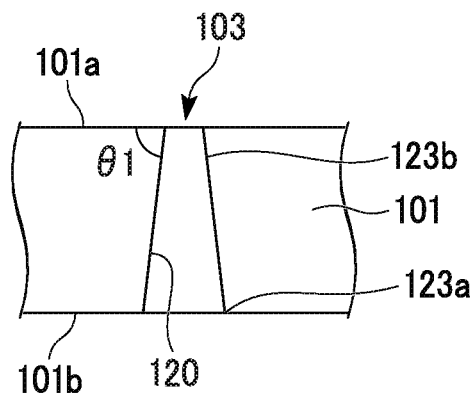
FIG. 10 is a cross-sectional view schematically showing another example of a shape of a pin which configures a mode converter according to an exemplary embodiment of the present invention.

In addition, as shown in FIG. 10, regarding the first through-hole 103, a diameter of the end portion 123b at another main surface 101b of the first substrate can be less than a diameter of the end portion 123a of the main surface 101a side, and an angle made by a sidewall surface of the first through-hole 103 and the main surface 101b of the first substrate can be θ1. In this case, millimeter-wave signals at the pin 120 can be to smoothly introduced. Moreover, the millimeter-wave signals can be smoothly introduced since the coupling efficiency with the waveguide can be improved.

Figure 11:
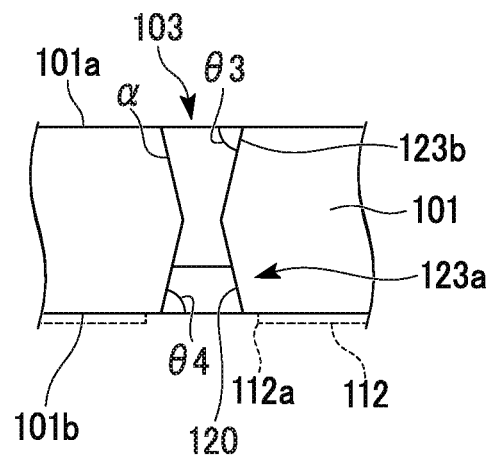
FIG. 11 is a cross-sectional view schematically showing another example of a shape of a pin which configures a mode converter according to an exemplary embodiment of the present invention.

Also, as shown in FIG. 11, regarding the first through-hole 103, the diameter can be decreased and then increased from the end portion 123b at another main surface 101b of the first substrate toward the end portion 123a of the main surface 101a. An angle made by a sidewall surface of the first through-hole 103 and another main surface 101b of the first substrate can be θ3 at the end portion 123b and θ4 at the end portion 123a. In this case, when the deposition process is performed from sides of both main surfaces of the first substrate, since the metal adhesion effect inside the first through-hole 103 is improved, the seed layer 121a and the conductive film having copper plating can be reliably formed.

Figure 12:
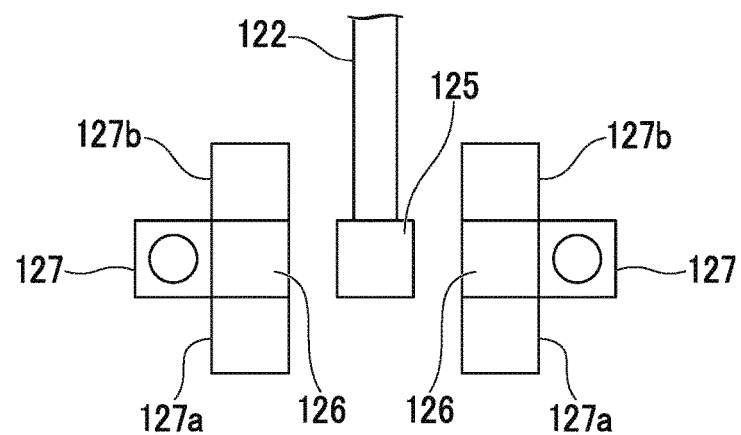
FIG. 12 is a cross-sectional view schematically showing an example of an arrangement of a ground (GND) via which configures a mode converter according to an exemplary embodiment of the present invention.

In the present exemplary embodiment as shown in FIG. 12, an end of the transmission line 122 that extends from the pin 120 is to be the GSG pad 125, and the GND connection vias 127 is adjacent to the GND pad 126. The GND connection via 127 may be on the other side of the GSG pad 125 with respect to the GND pad 126. However, as shown in FIG. 12, the via may be a GND connection via 127a located at a position where the transmission line 122 extended from the pin (not shown) with respect to the GND pad 126 is further extended, or a GND connection via 127b located at a side of the pin with respect to the GND pad 126. In addition, the GND connection via 127b may be arranged at a position shifted by an arbitrary length toward a direction of the GND via 127a, or may be arranged at a position shifted by an arbitrary length toward a direction of the GND via 127b. FIG. 12 is a plan view in which a plurality of GND vias each arranged in a different position with respect to the GND pad 126 is described in order to explain the position of the GND connection vias.

Figure 13:
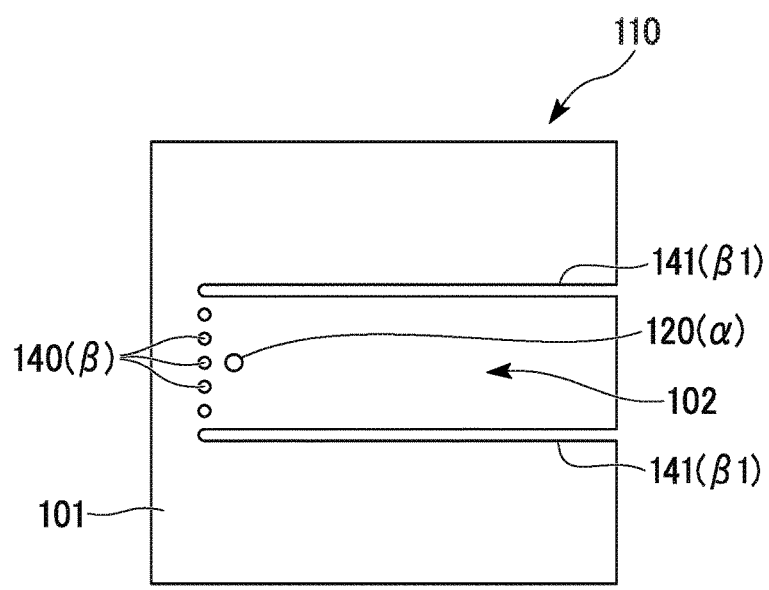
FIG. 13 is a perspective view schematically showing an example of a configuration of a waveguide which configures a mode converter according to an exemplary embodiment of the present invention.

Furthermore, in the present exemplary embodiment, as shown in FIG. 1, the waveguide 110 has the plurality of conductor columns 114. However, as shown in FIG. 13, in the waveguide 110 forming a rectangular shape in a plan view, a side serving as a rear wall facing the opening 102 includes a plurality of conductor columns 140. In addition, two sides extending in a direction from the pin 120 toward the opening 102 may include a slit wall 141 which is continuous in the direction thereof, and a continuous hole can be formed in the first and second processes.

By forming the side serving as the rear wall by a plurality of the conductor columns 140, even if a failure such as part of the conductor columns are electrically open is occurred, the remaining conductor columns can maintain the function as the waveguide 110. By forming the sidewall of the waveguide 110 as the continuous slit wall 141, it is possible to prevent leakage of electromagnetic waves.

Furthermore, in the present exemplary embodiment, as shown in FIG. 1, the sidewall of the waveguide 110 are constituted by a plurality of conductor columns arranged so as to separate from each other. However, as shown in FIG. 13, a sidewall of the waveguide may be formed by an integrated conductor. According to the configuration above, since the sidewall in the traveling direction of the electromagnetic wave is a continuous wall, it is possible to prevent disturbance of the electromagnetic wave due to discontinuity of the post arrangement.

Figure 14:
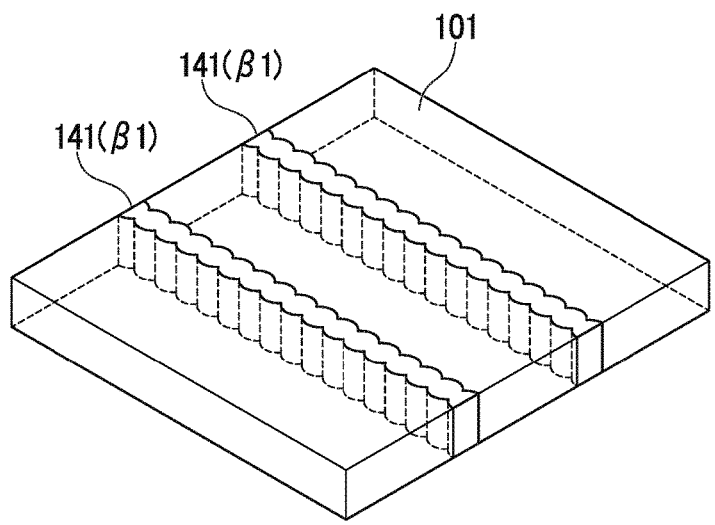
FIG. 14 is a perspective view schematically showing another example of a configuration of a waveguide which configures a mode converter according to an exemplary embodiment of the present invention.

When forming the second through-hole as described above, as shown in FIG. 14, it is also possible to form a shape such that multiple cylinders are continuously overlapped in a plan view.

Figure 15:
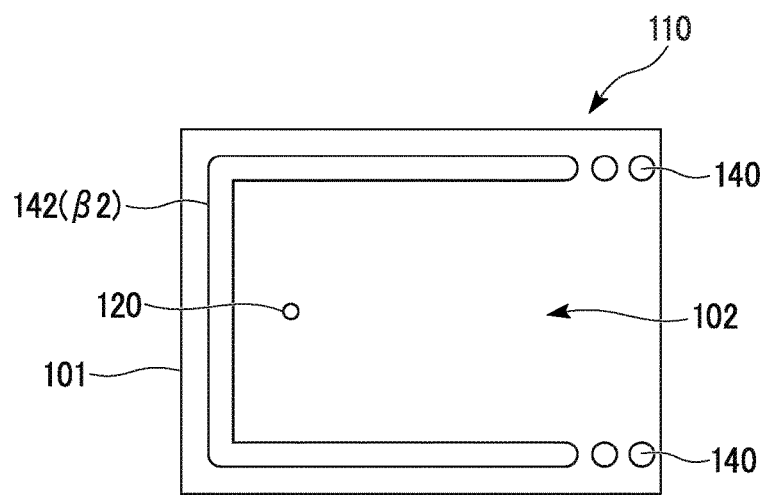
FIG. 15 is a perspective view schematically showing another example of a configuration of a waveguide which configures a mode converter according to an exemplary embodiment of the present invention.

As shown in FIG. 15, in the waveguide 110 having the rectangular shape, an elongated hole β2 is formed so as to be continuous across three sides of the rectangle other than the opening 102 to form a slit wall 142 that has a continuous U-shape. In addition, a waveguide 110 can include a conductor column 140 in which only a portion around the opening 102 is separated. In this case, it is possible to prevent the electromagnetic waves leaking from a surrounding of the pin when the electromagnetic wave is entered since the surrounding of the pin 120 is an enclosed space rather than a post.

Figure 16:
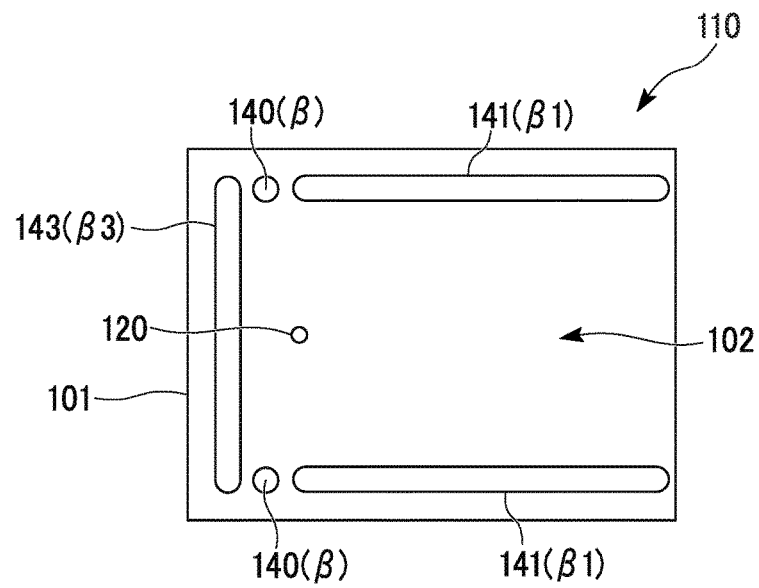
FIG. 16 is a perspective view schematically showing another example of a configuration of a waveguide which configures a mode converter according to an exemplary embodiment of the present invention.

As shown in FIG. 16, in the waveguide 110 having the rectangular shape, elongated holes β1, β3 are formed so as to be continuous across each of the three sides of the rectangle other than the opening 102, and with corresponding slit walls 141, 143, a conductor column 140 can be provided at portions where the sides mutually cross to form the waveguide 110 in a separate manner. In this case, since the discontinued portion corresponds to only one post, disturbance of the electromagnetic wave at the discontinued portion can be minimized and a structure which is more mechanically stable than the structure shown in FIG. 15 can be obtained. As described above, by forming the waveguide 110 such that the inner side and the outer side are continuous, the first substrate 101 is not separated.

Figure 17:
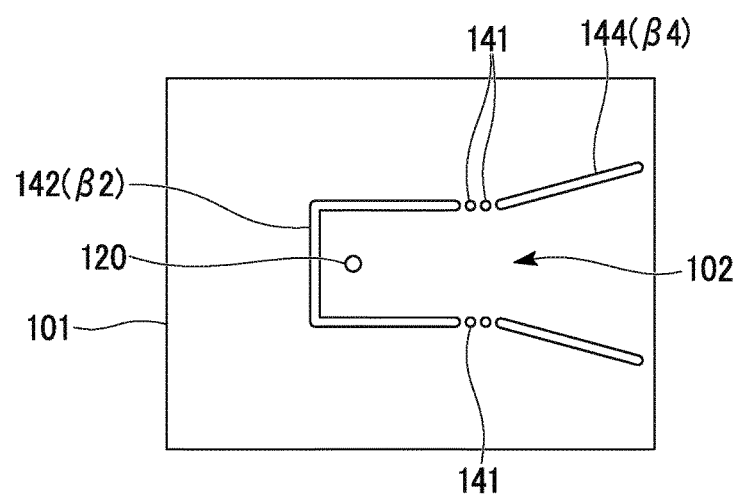
FIG. 17 is a perspective view schematically showing another example of a configuration of a waveguide which configures a mode converter according to an exemplary embodiment of the present invention.

As shown in FIG. 17, it is also possible to provide the slit wall 144 at the outside of the opening 102, the slit wall having a shape such that a distance between the slit walls 144 facing each other is increased. In this case, it is possible to configure a horn antenna where an H surface has a fan shape; thereby an antenna gain can be improved.

Figure 18:
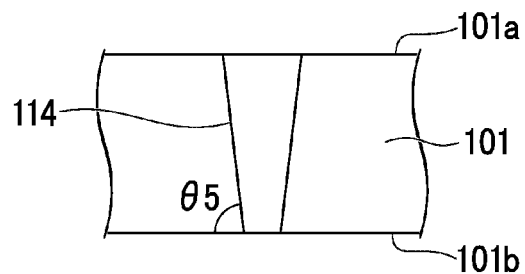
FIG. 18 is a cross-sectional view schematically showing another example of a shape of a conductor column which configures a mode converter according to an exemplary embodiment of the present invention.

In the exemplary embodiment described above, as shown in FIGS. 1-3, the diameter of the conductor column 114 is determined to be uniform from the main surface 101a of the first substrate 101 to another main surface 101b. However, as shown in FIG. 18, the diameter can be determined so as to decrease from the main surface 101a toward the main surface 101b to have an angle θ5. In this case, it is possible to improve the metal adhesion effect inside the hole to reliably form the seed layer and a conducting column having a copper plating. In addition, due to the angle θ5, it is possible to improve the metal adhesion effect inside the hole α to reliably form the seed layer and the conductive film having copper plating.

Figure 19:
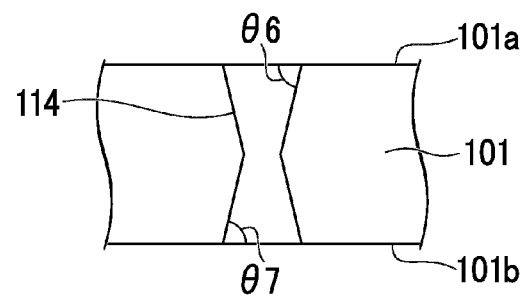
FIG. 19 is a cross-sectional view schematically showing another example of a shape of a conductor column which configures a mode converter according to an exemplary embodiment of the present invention.

Furthermore, as shown in FIG. 19, it is possible to form the conductive column 114 such that the diameter decreases and then increases from the main surface 101a toward the rear surface 101b to have angles θ6 and θ7. Due to the angles θ6 and θ7, it is possible to improve the metal adhesion effect inside the first through-hole 103 to reliably form the seed layer and the conductive film having copper plating.

Figure 20:
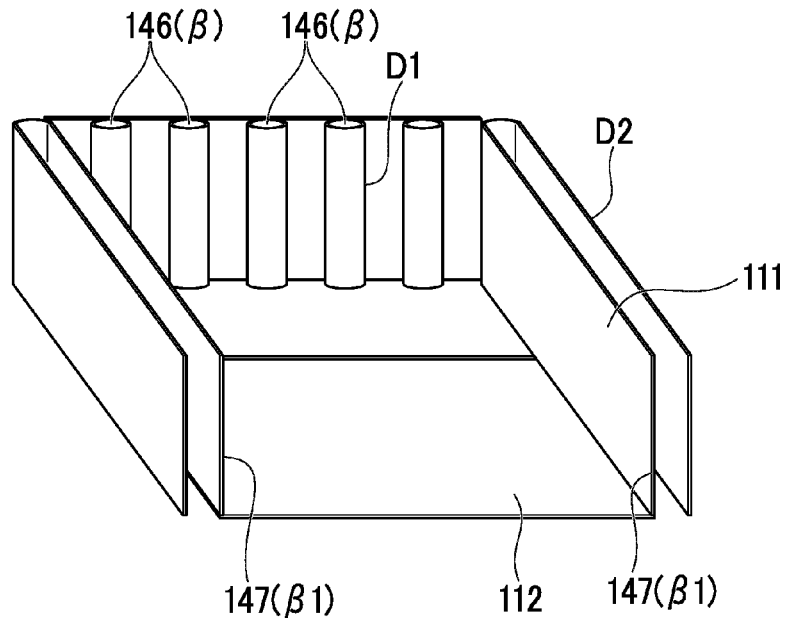
FIG. 20 is a perspective view schematically showing another example of a configuration of a waveguide which configures a mode converter according to an exemplary embodiment of the present invention.

It is also possible in the waveguide 110, as shown in FIG. 20, for the conductive films D1, D2 to be formed only on the surface of the conductive column 146 or only on to the surface of the slit wall 147. That is, the conductor is not filled with a plating inside the corresponding a hole β and an elongated hole β1 and can be hollow. In these cases, it is possible to provide the conductive films 111, 112 only on portions corresponding to opposite inner surfaces of the space of the slit wall 147. In this case, it is preferable that both ends of the conductor column 146 are reliably connected to the conductive films 111, 112.

Therefore, as shown, for example, in FIGS. 13-17 and 20, in the waveguide 110, due to a structure in which a portion of the conductor column 114 with a gap has slit walls 141, 142, 143, 144, or 147, most portions of the waveguide 110 between the conductive films 111, 112 which form the waveguide 100 can be replaced by the slit walls 141, 142, 143, 144, or 147. As a result, it is possible to suppress the leakage of electromagnetic waves to a greater extent than a conventional waveguide, and radiation efficiency of the antenna can be improved and radiation loss of the waveguide can be reduced. In addition, by adopting the slit wall, the area through which current flows increases compared to the case where only the conductor column 114 is provided. Therefore, it is possible to significantly reduce disorder and collapse of the transmission mode by electrical non-conduction of the conductive films 111, 112 and post wall 114 that can occur in all post walls 114, and to reduce risks caused by disorder and collapse.

Figure 21:
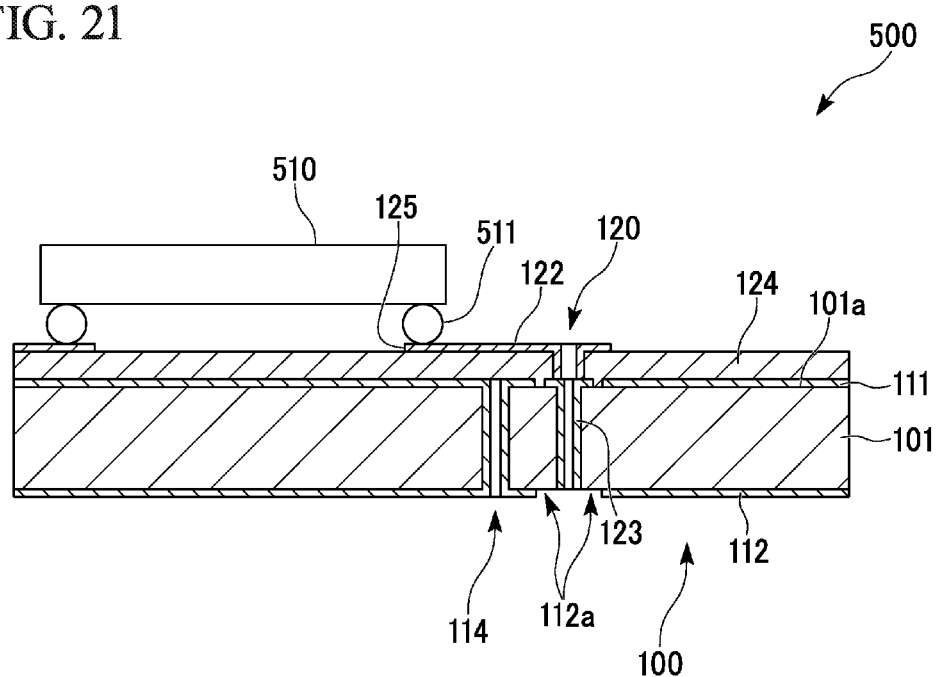
FIG. 21 is a cross-sectional view schematically showing a configuration in which a semiconductor chip is mounted on a mode converter according to an exemplary embodiment of the present invention.

FIG. 21 is a sectional view of a mode conversion module 500. As shown in FIG. 21, the mode conversion module 500 is constituted such that a wireless communication IC (semiconductor chip) 510 including a wireless transceiver functional element is flip-chip connected to a side where the plane circuit 122 of the mode converter 100 of the to present exemplary embodiment is arranged.

On the main surface 101a of the first substrate 101 constituting the mode converter 100 shown in FIG. 3, the transmission path 122 on the insulating portion 124 and the conductive film 111 forming the GND are provided, and at the same layer-level of the members, a circuit which is not shown is provided. The end portion 125 of the transmission line that serves as a GSG pad is connected to a terminal 511 of a wireless communication IC 510. Since the high frequency signals of millimeter waves and the like are significantly affected by parasitic inductance, it is preferable to the connect the terminal 511 to the terminal end 125 by making a short-range implementation using bumps rather than wire bonds. Since the electromagnetic field of the electromagnetic wave guided portion is blocked from the external environment by a continuous wall and a post, the electromagnetic field is not subject to external influences and the like.

Figure 22:
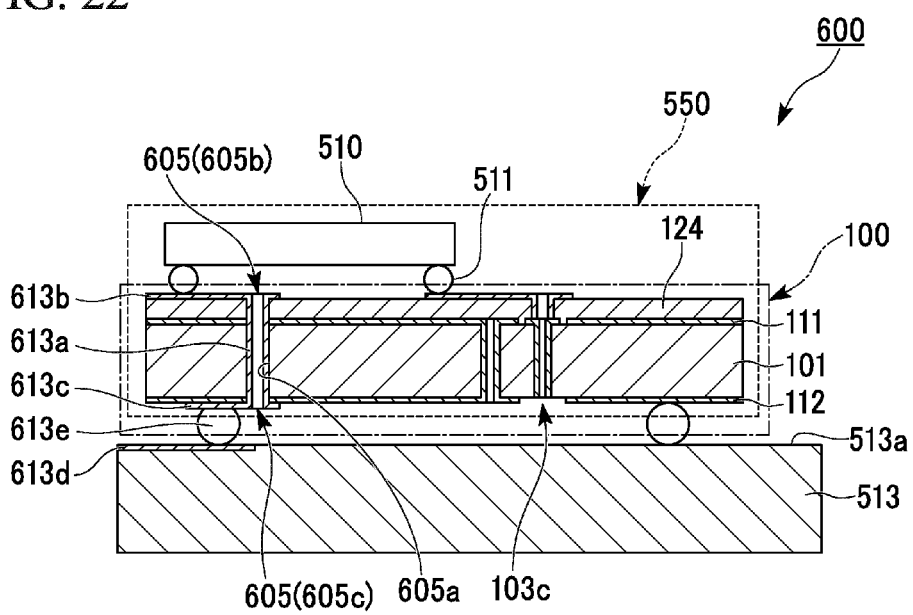
FIG. 22 is a cross-sectional view schematically showing an example of a configuration in which a semiconductor chip is mounted on a mode converter according to an exemplary embodiment of the present invention and the mode converter is mounted on the motherboard.

FIG. 22 is a sectional view of the mode converter unit 600 where the mode conversion module 550 is mounted on the second substrate (motherboard) 513. The mode conversion module 550 includes the third through-hole 605 which penetrates the mode converter 100 in the thickness direction thereof. By the third through-hole 605, a second substrate 513 and the wireless communication IC 510 are connected electrically. Between the second substrate 513 and the mode conversion module 550, an underfill material (not shown) may be filled. The ground conductor layer of the mode converter 100 and the anti-pad are coated with the underfill material, and the first substrate 101 and a second substrate 513 may be bonded. Components illustrated in FIG. 22, including components 513a. 605a. 605b, and -605c, and 613a. 613b. 613c. 613d, and -613e, except for the third through-hole 605 correspond to and are the same as the mode conversion module 500 in FIG. 21.

Figure 23:
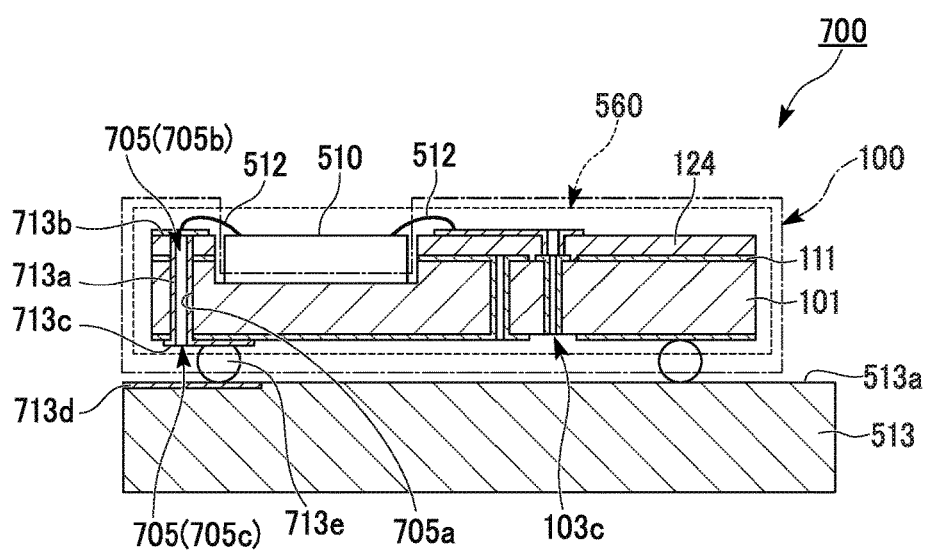
FIG. 23 is a cross-sectional view schematically showing another example of a configuration in which a semiconductor chip is mounted on a mode converter according to an exemplary embodiment of the present invention and the mode converter is mounted on the motherboard.

FIG. 23 is a sectional view of a mode converting unit 700 where the mode conversion module 560 having a structure different from that of the mode conversion module 500 in FIG. 21 is mounted on the second substrate (motherboard) 513. The mode conversion module 560 includes a semiconductor chip 510, and the conductive film 713b disposed on the surface of the mode converter 100 and a terminal (not shown) of the semiconductor chip 510 is electrically connected via a wire 512. The mode conversion module 560 includes a third through-hole 705 which penetrates the mode converter 100 in the thickness direction thereof. By the third through-hole 705, the second substrate 513 and the wireless communication IC 510 are connected electrically. Between the second substrate 513 and the mode conversion module 560, an underfill material (not shown) may be filled. The ground conductor layer of the mode converter 100 and the anti-pad are coated with the underfill material, and the first substrate 101 and a second substrate 513 may be bonded. Components, including 513a. 705a. 705b, and -705c, and 713a, 713b, 713c. 713d, and -713c, except for the wireless communication IC 510 and the third through-hole 705 correspond to and are the same as components of the mode conversion module 500 in FIG. 21.

EXAMPLES

Hereinbelow, the present invention is described in more detail with reference to Examples 1-6 according to the embodiments described above; however, examples to which the present invention can be applied are not limited to these.

Example 1

Figure 24:
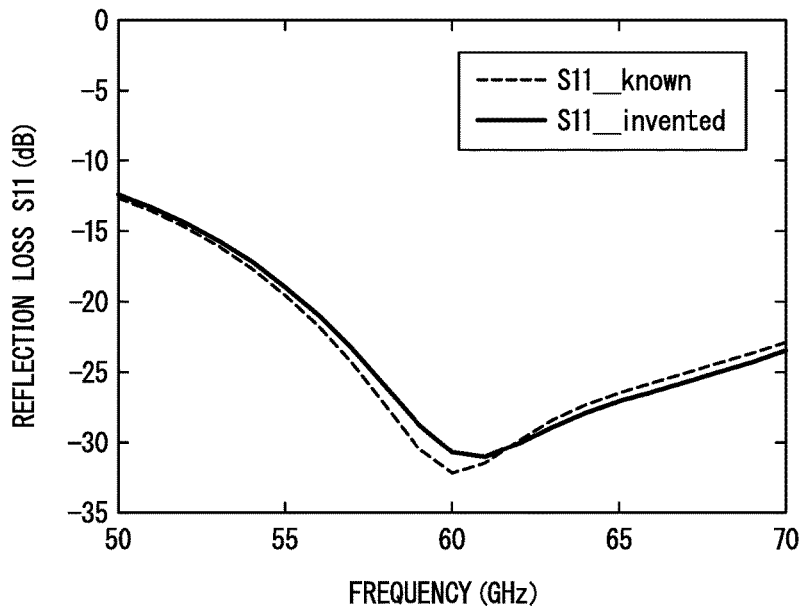
FIG. 24 is a graph describing controllability of reflection losses of signals according to a mode converter of an exemplary embodiment of the present invention.

Example 1 using the above mode converter is described. Regarding each of a case that uses a mode converter according to the present exemplary embodiment (FIG. 5) and a case that uses a mode converter according to prior art (FIG. 35), simulations were performed on components to be reflected (i.e., reflection loss) of the signals which were transmitted to pins from the plane circuit (high-frequency transmission line). The software HFSS for a three-dimensional electromagnetic-field analysis was used in the simulation, and both in the present exemplary embodiment and in prior art, the thickness of the first substrate was 850 µm. The simulation results are shown in the graph of FIG. 24. In the mode converter of the present exemplary embodiment, the size of the other anti-pad of the first substrate was 100 µm.

The horizontal axis of the graph represents the frequency in GHz of the signal to be propagated to the pin from the transmission circuit, and the vertical axis represents the reflection loss S11 in dB of the propagated signals from the pin. The solid line (i.e. s11 invented) on the graph corresponds to the results of the mode converter of the present exemplary embodiment, and the dashed line (i.e. s11 known) corresponds to the results of the mode converter of the prior art. As shown in the graph, since the two lines substantially correspond with each other, in either mode converter according to the present exemplary embodiment or the prior art, it was found that frequency dependence of the same reflection loss can be obtained. Therefore, by forming a pin so as to penetrate the first substrate as in the present exemplary embodiment to adjust the size of the anti-pad, it is found that it is possible to achieve impedance matching at a similar level as when the length of the pin itself is adjusted as in the prior art.

Example 2

Figure 25:
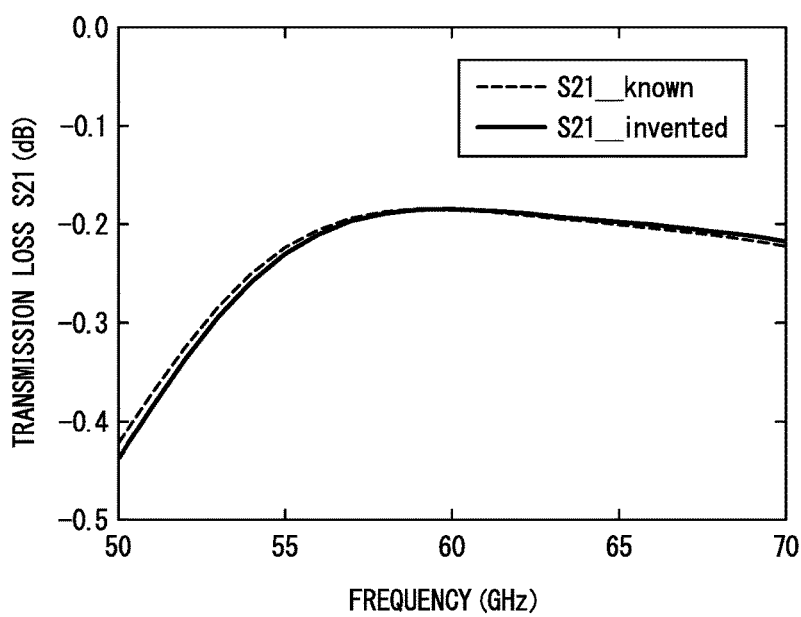
FIG. 25 is a graph describing controllability of reflection losses of signals according to a mode converter of an exemplary embodiment of the present invention.

Example 2 using the above mode converter is described. Regarding each of a case that uses a mode converter according to the present exemplary embodiment (FIG. 5) and a case that uses a mode converter according to prior art (FIG. 35), simulations were performed on components to be leaked from an opening portion at another main surface 301b of the first substrate (i.e., transmission loss) of the signals which were transmitted from the plane circuit. The software HFSS for a three-dimensional electromagnetic-field analysis was used in the simulation, and both in the present exemplary embodiment and in prior art, the thickness of the first substrate was 850 µm. The simulation results are shown in the graph of FIG. 25. In the mode converter of the present exemplary embodiment, the size of the other anti-pad of the first substrate was 100 µm.

The horizontal axis of the graph represents the frequency in GHz of the signal to be propagated to the pin from the transmission circuit, and the vertical axis represents the transmission loss S21 in dB of the propagated signals from the pin. The solid line (i.e. s11 invented) on the graph corresponds to the results of the mode converter of the present exemplary embodiment, and the dashed line (i.e. s11 known) corresponds to the results of the mode converter of the prior art. As shown in the graph, since the two lines substantially correspond with each other, in either mode converter according to the present exemplary embodiment or the prior art, it was found that similar frequency dependency of the same transmission loss was obtained Therefore, as a structure in which a pin penetrates through the first substrate is adopted in the present exemplary embodiment, even when the space inside the pin is externally exposed, it is found that the transmission loss was similarly reduced as when the space inside the pin is sealed inside the first substrate as described in the prior art.

Example 3

Figure 26A:
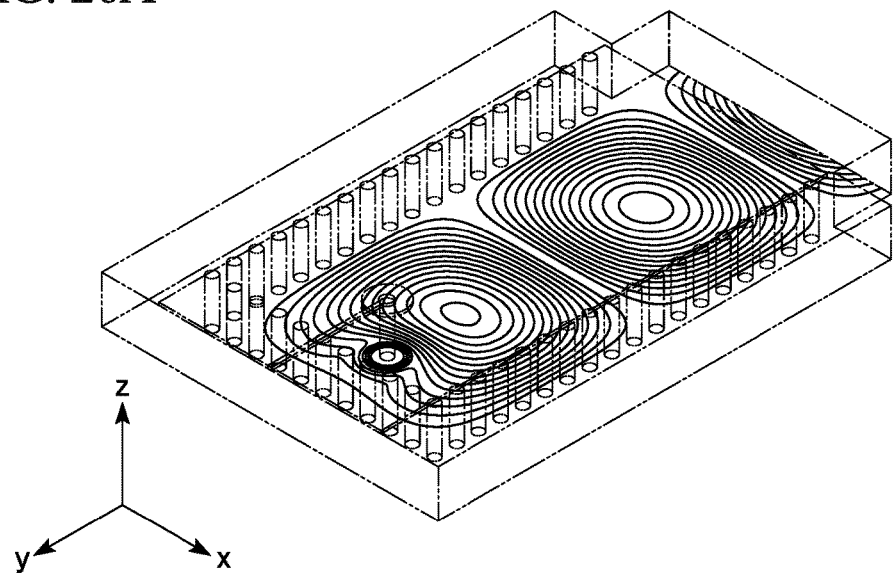
FIG. 26A is a drawing describing an electric field distribution generated by a mode converter of an exemplary embodiment of the present invention.
Figure 26B:
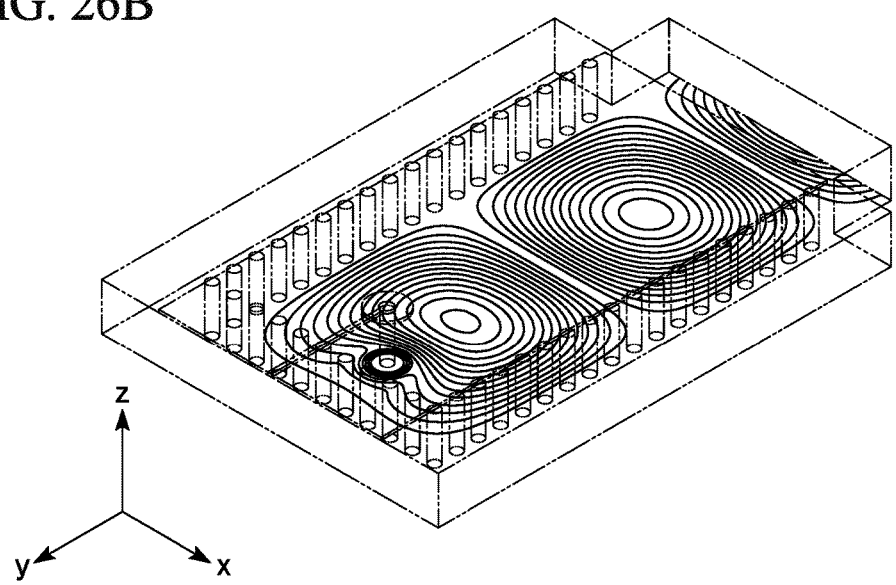
FIG. 26B is a drawing describing an electric field distribution generated by a mode converter of an exemplary embodiment of the present invention.

Example 3 using the above mode converter is described. Regarding each of a case that uses a mode converter according to the present exemplary embodiment (FIG. 5) and a case that uses a mode converter according to prior art (FIG. 35), simulations were performed on an electric field distribution generated inside the first substrate when the mode converter is operated. The software HFSS for a three-dimensional electromagnetic-field analysis was used in the simulation, and both in the present exemplary embodiment and in prior art, the thickness of the first substrate was 850 µm. The simulation results of the prior art and the present exemplary embodiment are respectively shown FIG. 26A and FIG. 26B. However, the electric field distribution is varied over time in practice, and therefore, these graphs show the electric field distribution at a certain moment.

In order to show the electric field distribution generated in the inside of the mode converter 300, components other than the conductor columns 314, the transmission line 322, the pin 320, the lands 323c and 322b, and the anti-pad 312a are not shown. In the mode converter of the present exemplary embodiment, the size of the anti-pad 312a was 100 µm.

A y-axis represents a direction from the opening portion 303b of the pin toward the GSG pad 125 shown in FIG. 2, an X-axis represents a direction that makes a 90-degree angle to the y-axis within a plane parallel to both main surfaces 301a, 301b of to the first substrate, and a z-axis represents a direction from another main surface 301b of the first substrate toward the main surface 301a. In both of the simulation results of FIG. 26A and FIG. 26B, the distribution shows that a portion in which the electric field is the strongest is presented in the vicinity of the pin, and the electric field is weakened in inverse proportion to a distance from the strongest portion. Each of the portions in which the electric field is the strongest is arranged periodically at predetermined intervals in a (−y) direction which is away from the pin 120, and a similar distribution is shown at each of the portions. When comparing the simulation results at respective positions having the same distance from the pin using FIGS. 26A and 26B, it is found that both of the electric field distributions were almost coincident.

Example 4

Figure 27:
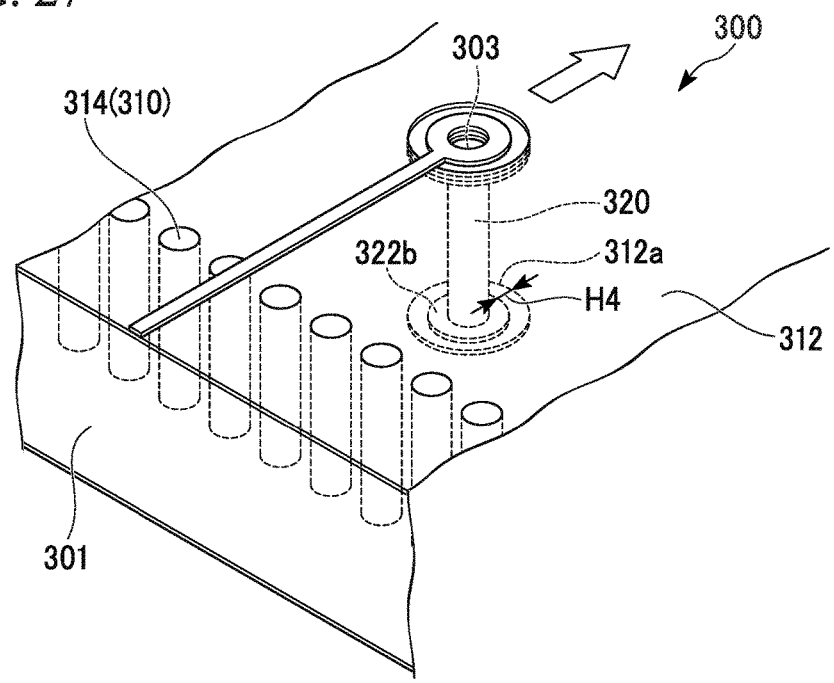
FIG. 27 is a perspective view schematically showing an anti-pad in a mode converter according to an exemplary embodiment of the present invention.

Example 4 using the above mode converter is described. Regarding a case that uses a mode converter according to the present exemplary embodiment (FIG. 5), simulations were performed on a ratio of reflected signals among signals excited in the pin from the plane circuit (i.e., reflection loss) using the anti-pads each having different sizes. In the present Example, the anti-pad 312a had a circular ring shape, and each difference H4 between the inner diameter and the outer diameter was set in a range of 30 µm or more and less than 90 µm and was incremented by 10 µm. In FIG. 27, a shape of the anti-pad 312a is schematically shown. Here, the land 322b having a circular ring-shape that controls the capacitance value due to the anti-pads is formed on a tip of the pin. Therefore, in this case, H4 also can be referred to as the difference between the outer diameter of the land 322b and the outer diameter of the anti-pad 312a. The outer diameter of the land 322b is larger than the outer diameter of the pin 320, and the center of the land 322b is arranged to be coincident with the center of the pin. During the operation of the mode converter 300, an electric field in a vertical direction with respect to the thickness direction of the substrate 301 is generated from the outer peripheral surface of the land 322b toward the ground conductor layer 312. The travelling direction of the electromagnetic waves in TE mode is indicated by arrows. By using the anti-pad having a circular-shape, the stress between the conductor and substrate can be reduced, and the tip structure of the pin of the present exemplary embodiment can be manufactured easily.

Figure 28:
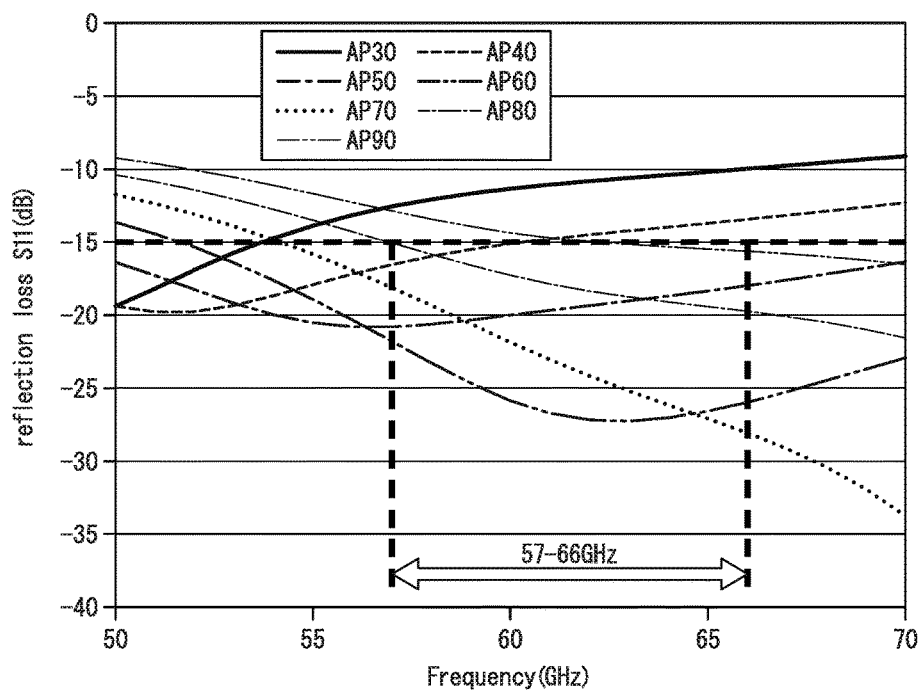
FIG. 28 is a graph describing the anti-pad size dependence of reflection losses of signals according to a mode converter of an exemplary embodiment of the present invention.

The software HFSS for a three-dimensional electromagnetic-field analysis was used in the simulation, and both in the present exemplary embodiment and in prior art, the thickness of the first substrate was 850 μm. In addition, a resin was filled in the inside of the first through-hole 303, and was simulated as a dielectric having relative permittivity of 3.4. The results are shown in the graph of FIG. 28.

The horizontal axis of the graph represents the frequency in GHz of the signal to be propagated to the pin from the transmission circuit, and the vertical axis shows the reflection loss S11 (in dB) in the pins of the signal propagated. As sufficient reflection loss S11 for the mode converter was approximately −15 dB or less, −15 dB was set to be a threshold value. In addition, the used frequency band was approximately 57-66 GHz. Each line shows a result of a different size of the anti-pad (i.e., H4). For example, "AP##" (## is 30, 40, 50, 60, 70, 80 or 90) shows a result when the size of the anti-pad is ## μm.

From the results shown in the graph, the amount of reflection loss was found to vary depending on the size of the anti-pad. When the anti-pad was formed so as to have H4 of 50 μm or more and less than 80 μm, a reflection loss showed a threshold value or less in the used frequency band described above. Therefore, the size of the anti-pad (i.e., H4) was preferably 50 μm or more and less than 80 μm. Therefore, even when dielectric is not filled, it is found that the control of the reflection loss in the pin, that is, the control to match the impedance of the pin with the impedance of the plane circuit is possible.

Example 5

Figure 29:
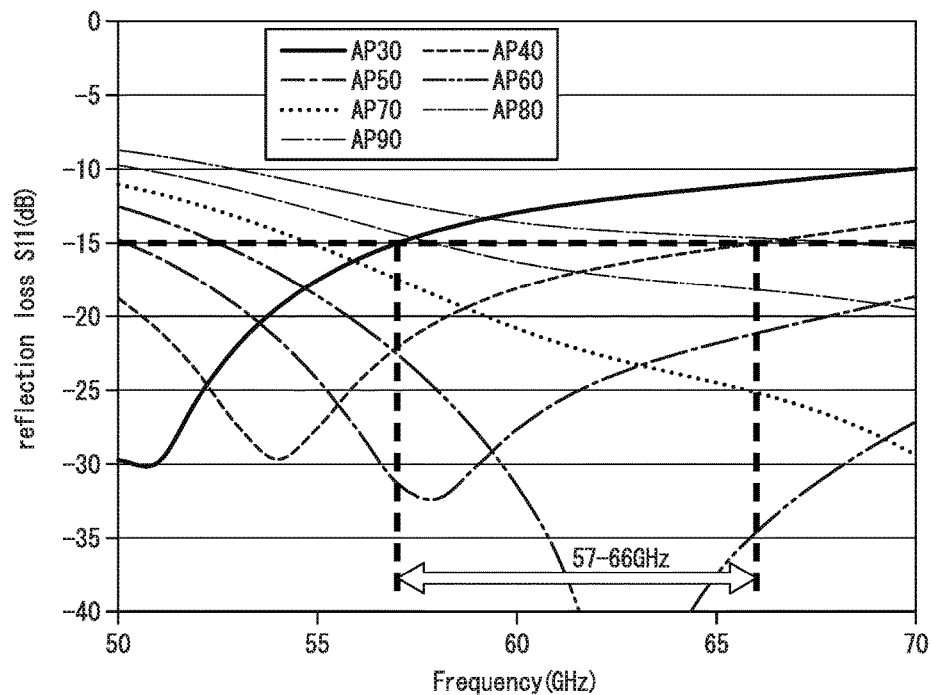
FIG. 29 is a graph describing the anti-pad size dependence of reflection losses of signals according to another mode converter of an exemplary embodiment of the present invention.

Except that the inside of the first through-hole 303 was not filled with dielectric, a simulation was carried out under similar experimental conditions using the mode converter similar to that in Example 4. The simulation results are shown in the graph of FIG. 29. Each line shows a result of a different size of the anti-pad (i.e., H4). For example, "AP##" (## is 30, 40, 50, 60, 70, 80 or 90) shows a result when the size of the anti-pad is ## μm.

From the results shown in the graph, the amount of reflection loss was found to vary depending on the size of the anti-pad. When the anti-pad was formed so as to have H4 of 40 μm or more and less than 80 μm, a reflection loss showed a threshold value or less in the used frequency band described above. Therefore, the size of the anti-pad (i.e., H4) was preferably 40 μm or more and less than 80 μm. Therefore, even when dielectric is not filled, it is found that the control of the reflection loss in the pin, that is, the control to match the impedance of the pin with the impedance of the plane circuit is possible.

Example 6

Figure 30:
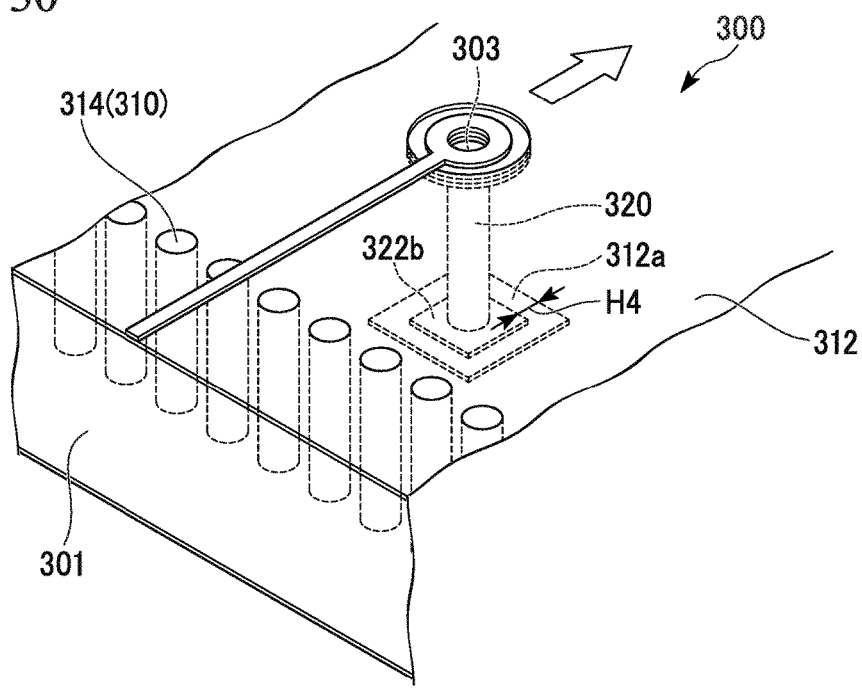
FIG. 30 is a perspective view schematically showing another anti-pad in a mode converter according to an exemplary embodiment of the present invention.

Simulations which were similar to the simulations described in Example 4 were performed using the anti-pad 312a having the rectangular ring-shape. The same mode converter as in Example 4 was used and the experimental conditions were also the same. In FIG. 30, a shape of the anti-pad is shown schematically. Regarding the anti-pad 312a having the rectangular ring-shape used in the simulation, as the width H4 shown in FIG. 5 having a range of 40 μm or more and less than 120 μm, the width of 40, 50, 60, 80, and 120 μm were adopted. Here, the land 322b having the rectangular ring-shape to control the capacitance value due to the anti-pad is formed at the tip of the pin 320. Therefore, in this case. H4 is a distance between one side of the land 322b and one side of the ground conductor layer 312 opposite to each other across a region to be insulated. A length from a center of the land 322b to an outer frame is greater than the outer diameter of the pin 320, and the center of the land 322b corresponds to the center of the pin 320. While the mode converter 300 is operated, the electric field having a direction vertical to a thickness direction of the substrate 301 is generated from the outer peripheral surface of the land 322b to the ground conductor layer 312. When the anti-pad having a rectangular shape is used, since an electric field of a direction including a lot of components, each having a direction vertical to the thickness direction of the substrate (i.e., transverse components), are generated, it is possible to induce the TE mode more efficiently. The travelling direction of the electromagnetic waves in TE mode is indicated by arrows. In addition, in order to efficiently generate the transverse components, it is preferable that the side of the land 322b and the side of the outer frame of the anti-pad 312a having a rectangular shape are arranged so as to be parallel to each other having a distance of H4 therebetween and be vertical to a direction shown by the arrow in which the electromagnetic wave of the TE mode propagates.

Figure 31:
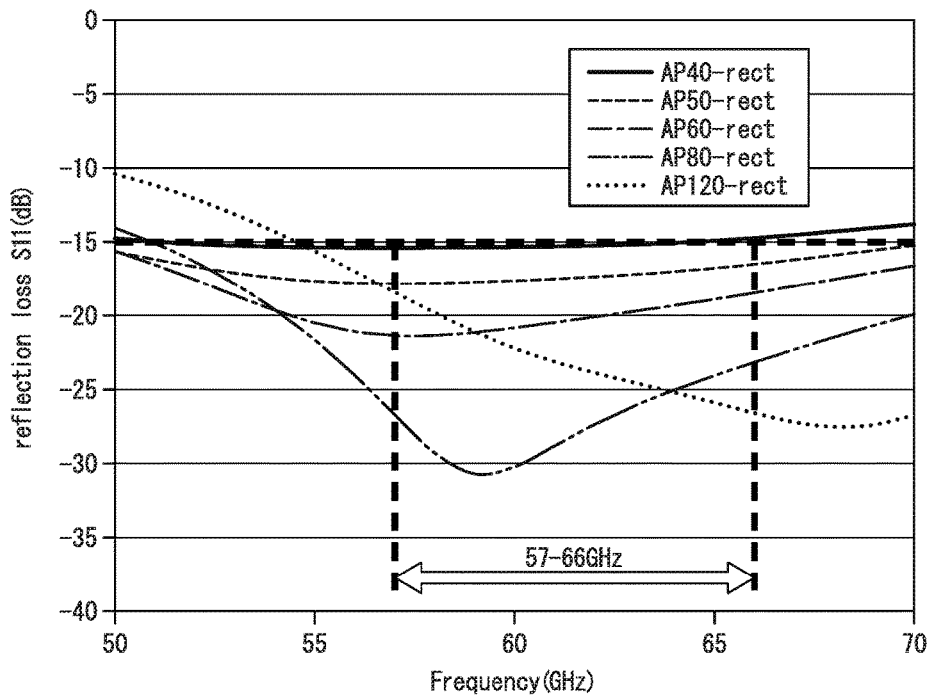
FIG. 31 is another graph describing the anti-pad size dependence of reflection losses of signals according to another mode converter of an exemplary embodiment of the present invention.

The simulation results are shown in the graph of FIG. 31. Each line shows a result of a different size of the rectangular shape anti-pad (i.e., H4). For example, "AP##-rect" (## is 40, 50, 60, 80 or 120) shows a result when the size of the rectangular shape anti-pad is ## μm.

From the results shown in the graph, even when the anti-pad having a rectangular-ring shape was used, an amount of the reflection loss was found to vary depending on the size of the anti-pad. In the entire range where H4 was 40-120 μm, a reflection loss showed a threshold value or less in the used frequency band described above. Therefore, the size of the anti-pad was preferably 40-120 μm. Therefore, it is found that the control of the reflection loss in the pin, that is, the control to match the impedance of the pin with the impedance of the plane circuit is possible.

Example 7

Figure 32:
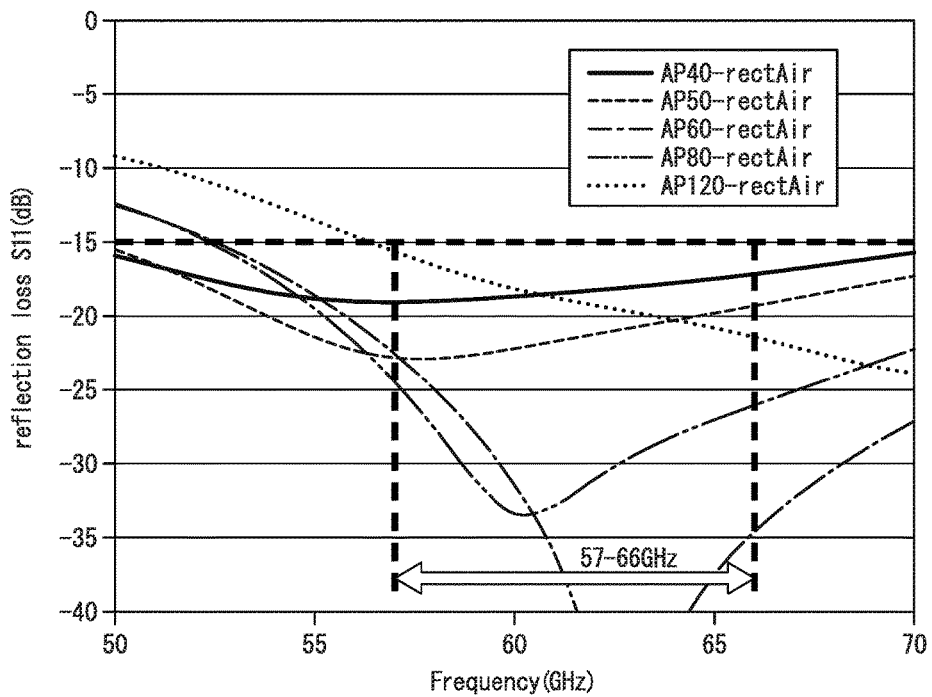
FIG. 32 is another graph describing the anti-pad size dependence of reflection losses of signals according to another mode converter of an exemplary embodiment of the present invention.

Except that the inside of the first through-hole 203 was not filled with dielectric, a simulation was carried out under the similar experimental conditions using the mode converter similar to that in Example 6. The simulation results are shown in the graph of FIG. 32. Each line shows a result of a different size of the rectangular shape anti-pad (i.e., H4). For example, "AP-##-rectAir" (## is 40, 50, 60, 80 or 120) shows a result when the size of the rectangular shape anti-pad is ## μm.

From the results shown in the graph, the amount of the reflection loss was found to vary depending on the size of the anti-pad. In the entire range where H4 was 40-120 μm, a reflection loss showed a threshold value or less in the used frequency band described above. Therefore, the size of the anti-pad was preferably 40-120 μm. Therefore, even when dielectric is not filled, it is found that the control of the reflection loss in the pin, that is, the control to match the impedance of the pin with the impedance of the plane circuit is possible.

Preferred embodiments of the present invention have been described above; however, the present invention is not limited by the foregoing examples. Additions, omissions, substitutions, and other modifications to the structure are possible insofar as they do not depart from the spirit of the present invention.

The present invention is widely applicable to a device for high-capacity and high-speed communication of several Gbps using a millimeter-wave band.

What is claimed is:

1. A mode converter comprising:
 a substrate comprising a first main surface and a second main surface;
 a first ground conductor layer formed on the first main surface;
 a second ground conductor layer formed on the second main surface;
 a plane circuit that is formed on the first main surface and propagates a high frequency;
 a pin that is connected to the plane circuit, is formed inside a through-hole which penetrate from the first main surface to the second main surface, and communicates with the first main face and the second main surface, wherein the pin comprises a land which extends on the second main surface; and
 an anti-pad that is formed between the land in the second main surface and the second ground conductor layer;
 wherein the anti-pad comprises a circular ring shape, and
 wherein a dielectric material is filled in the through hole.

2. The mode converter according to claim 1, wherein in the anti-pad comprising the circular ring shape, a difference of an outer diameter of the circular ring shape and an inner diameter of the circular ring shape is 50 to 80 μm.

3. The mode converter according to claim 1, wherein the pin is formed along an inner wall of the through-hole and comprises a cylindrical shape.

4. The mode converter according to claim 1, wherein in the anti-pad comprising the circular ring shape, a difference of man outer diameter of the circular ring shape and an inner diameter of the circular ring shape is 40 to 80 μm.

5. A mode converter comprising:
 a substrate comprising a first main surface and a second main surface;
 a first ground conductor layer formed on the first main surface;
 a second ground conductor layer formed on the second main surface;
 a plane circuit that is formed on the first main surface and propagates a high frequency;
 a pin that is connected to the plane circuit and is formed inside a through-hole which penetrates from the first main surface to the second main surface and communicates with the first main surface and the second main surface; and
 and anti-pad that is formed between an end portion of the pin exposed in the second main surface and the second ground conductor layer,
 wherein the anti-pad comprises a rectangular ring shape.

6. The mode converter according to claim 5, wherein the pin is formed along an inner wall of the through-hole and comprises a cylindrical shape.

7. The mode converter according to claim 5, wherein the pin comprises a land which extends on the second main surface.

8. The mode converter according to claim 5, wherein in the anti-pad comprising a rectangular ring shape, a length between an outer side of the rectangular ring shape and an inner side of the rectangular ring shape is 40 to 120 μm.

9. The mode converter according to claim 5, wherein a dielectric material is filled in the through-hole.

* * * * *